(12) United States Patent
Pelrine et al.

(10) Patent No.: US 7,468,575 B2
(45) Date of Patent: Dec. 23, 2008

(54) ELECTROACTIVE POLYMER ELECTRODES

(75) Inventors: Ronald E. Pelrine, Longmont, CO (US);
Roy D. Kornbluh, Palo Alto, CA (US);
Qibing Pei, Temecula, CA (US); Jose P. Joseph, Palo Alto, CA (US)

(73) Assignee: SRI International, Menlo Park, CA (US)

( * ) Notice: Subject to any disclaimer, the term of this patent is extended or adjusted under 35 U.S.C. 154(b) by 4 days.

(21) Appl. No.: 11/774,918

(22) Filed: Jul. 9, 2007

(65) Prior Publication Data

US 2008/0191585 A1 Aug. 14, 2008

Related U.S. Application Data

(60) Division of application No. 11/335,805, filed on Jan. 18, 2006, now Pat. No. 7,259,503, which is a continuation of application No. 10/893,730, filed on Jul. 16, 2004, now Pat. No. 7,049,732, which is a division of application No. 09/619,847, filed on Jul. 20, 2000, now Pat. No. 6,812,624.

(60) Provisional application No. 60/144,556, filed on Jul. 20, 1999, provisional application No. 60/153,329, filed on Sep. 10, 1999, provisional application No. 60/161,325, filed on Oct. 25, 1999, provisional application No. 60/181,404, filed on Feb. 9, 2000, provisional application No. 60/187,809, filed on Mar. 8, 2000, provisional application No. 60/192,237, filed on Mar. 27, 2000, provisional application No. 60/184,217, filed on Feb. 23, 2000.

(51) Int. Cl.
*H01L 41/047* (2006.01)
(52) U.S. Cl. .................... 310/363; 310/365
(58) Field of Classification Search ............ 310/363, 310/365
See application file for complete search history.

(56) References Cited

U.S. PATENT DOCUMENTS

| | | | |
|---|---|---|---|
| 3,403,234 | A | 9/1968 | Barnes, Jr. |
| 3,832,580 | A | 8/1974 | Yamamuro et al. |
| 4,290,983 | A | 9/1981 | Sasaki et al. |
| 4,342,936 | A | 8/1982 | Marcus et al. |
| 4,384,394 | A | 5/1983 | Lemonon et al. |
| 4,400,634 | A | 8/1983 | Micheron |

(Continued)

FOREIGN PATENT DOCUMENTS

JP 4-353279 12/1992

(Continued)

OTHER PUBLICATIONS

Ajluni, Cheryl, "Pressure Sensors Strive to Stay on Top, New Silicon Micromachining Techniques and Designs Promise Higher Performance", *Electronic Design—Advanced Technology Series*, Oct. 3, 1994, pp. 67-74.

(Continued)

*Primary Examiner*—Thomas M Dougherty
(74) *Attorney, Agent, or Firm*—Beyer Law Group LLP

(57) ABSTRACT

Described herein are transducers, their use and fabrication. The transducers convert between mechanical and electrical energy. The present invention further relates to compliant electrodes that conform to the shape of a polymer included in a transducer.

14 Claims, 15 Drawing Sheets

U.S. PATENT DOCUMENTS

| | | | |
|---|---|---|---|
| 4,401,911 A | 8/1983 | Ravinet et al. | |
| 4,518,555 A | 5/1985 | Ravinet et al. | |
| 4,783,888 A | 11/1988 | Fujii et al. | |
| 4,843,275 A | 6/1989 | Radice | |
| 4,879,698 A | 11/1989 | Langberg | |
| 4,885,783 A | 12/1989 | Whitehead et al. | |
| 4,969,197 A | 11/1990 | Takaya | |
| 5,024,872 A | 6/1991 | Wilson et al. | |
| 5,229,979 A | 7/1993 | Scheinbeim et al. | |
| 5,240,004 A | 8/1993 | Walinski et al. | |
| 5,250,784 A | 10/1993 | Muller et al. | |
| 5,254,296 A | 10/1993 | Perlman | |
| 5,356,500 A | 10/1994 | Scheinbeim et al. | |
| 5,369,995 A | 12/1994 | Scheinbeim et al. | |
| 5,430,565 A | 7/1995 | Yamanouchi et al. | |
| 5,438,553 A | 8/1995 | Wilson et al. | |
| 5,440,194 A | 8/1995 | Beurrier | |
| 5,495,137 A | 2/1996 | Park et al. | |
| 5,642,015 A | 6/1997 | Whitehead et al. | |
| 5,751,090 A | 5/1998 | Henderson | |
| 5,835,453 A | 11/1998 | Wynne et al. | |
| 5,902,836 A | 5/1999 | Bennett et al. | |
| 5,915,377 A | 6/1999 | Coffee | |
| 5,928,547 A | 7/1999 | Shea et al. | |
| 5,977,685 A | 11/1999 | Kurita et al. | |
| 6,048,622 A | 4/2000 | Hagood, IV et al. | |
| 6,060,811 A | 5/2000 | Fox et al. | |
| 6,084,321 A | 7/2000 | Hunter et al. | |
| 6,184,608 B1 | 2/2001 | Cabuz et al. | |
| 6,184,609 B1 | 2/2001 | Johansson et al. | |
| 6,228,533 B1 | 5/2001 | Ohashi | |
| 6,248,262 B1 | 6/2001 | Kubotera | |
| 6,249,076 B1 | 6/2001 | Madden et al. | |
| 6,291,155 B1 | 9/2001 | Raguse | |
| 6,376,971 B1 | 4/2002 | Kornbluh et al. | |
| 6,379,393 B1 | 4/2002 | Mavroidis et al. | |
| 6,379,809 B1 | 4/2002 | Simpson et al. | |
| 6,433,689 B1 | 8/2002 | Hovind et al. | |
| 6,495,945 B2 | 12/2002 | Yamaguchi et al. | |
| 6,514,237 B1 | 2/2003 | Maseda | |
| 6,543,110 B1 | 4/2003 | Joseph et al. | |
| 6,545,384 B1 | 4/2003 | Kornbluh et al. | |
| 6,583,533 B2 | 6/2003 | Kornbluh et al. | |
| 6,652,938 B1 | 11/2003 | Nishikawa et al. | |
| 6,673,533 B1 | 1/2004 | Wohlstadter | |
| 6,743,273 B2 | 6/2004 | Chung | |
| 6,781,284 B1 | 8/2004 | Pelrine et al. | |
| 6,800,155 B2 | 10/2004 | Senecal | |
| 6,812,624 B1 | 11/2004 | Pei et al. | |
| 6,824,689 B2 | 11/2004 | Wang | |
| 6,847,153 B1 | 1/2005 | Balizer | |
| 6,911,764 B2 | 6/2005 | Pelrine | |
| 6,940,211 B2 | 9/2005 | Pelrine et al. | |
| 7,011,760 B2 | 3/2006 | Wang | |
| 7,029,056 B2 | 4/2006 | Browne | |
| 7,034,432 B1 | 4/2006 | Pelrine | |
| 7,049,732 B2 | 5/2006 | Pei | |
| 7,063,377 B2 | 6/2006 | Brei | |
| 7,075,162 B2 | 7/2006 | Unger | |
| 7,104,146 B2 | 9/2006 | Benslimane | |
| 7,109,643 B2 | 9/2006 | Hirai | |
| 7,144,616 B1 | 12/2006 | Unger | |
| 2002/0013545 A1 | 1/2002 | Soltanpour et al. | |
| 2002/0050454 A1 | 5/2002 | Shahinpoor | |
| 2002/0050769 A1* | 5/2002 | Pelrine et al. | 310/363 |
| 2003/0141787 A1* | 7/2003 | Pelrine et al. | 310/365 |
| 2004/0263028 A1 | 12/2004 | Pei et al. | |
| 2005/0085693 A1 | 4/2005 | Belson | |
| 2005/0200984 A1 | 9/2005 | Browne | |
| 2005/0230546 A1 | 10/2005 | McKnight | |
| 2005/0234139 A1 | 10/2005 | Browne | |
| 2005/0275246 A1 | 12/2005 | Browne | |
| 2006/0057377 A1 | 3/2006 | Harrison | |
| 2006/0113878 A1* | 6/2006 | Pei et al. | 310/363 |
| 2006/0118895 A1 | 6/2006 | Unger | |
| 2006/0258912 A1 | 11/2006 | Belson | |

FOREIGN PATENT DOCUMENTS

| | | |
|---|---|---|
| JP | 5-202707 | 8/1993 |
| JP | 7-240544 | 9/1995 |
| JP | 2005-762463 | 10/1995 |
| JP | 10-321482 | 12/1998 |
| JP | 2001-286162 | 10/2001 |
| WO | WO 87/07218 | 12/1987 |
| WO | WO 89/02658 | 3/1989 |
| WO | WO 95/08905 | 3/1995 |
| WO | WO 98/35529 | 8/1998 |
| WO | WO 99/17929 | 4/1999 |
| WO | WO 99/37921 | 7/1999 |
| WO | WO 01/06575 | 1/2001 |
| WO | WO 01/06579 | 1/2001 |
| WO | WO 01/59852 | 8/2001 |
| WO | WO 2006/121818 | 11/2006 |
| WO | WO 2006/123317 | 11/2006 |
| WO | WO 2007/029275 | 3/2007 |

OTHER PUBLICATIONS

Anderson, R. A., "Mechanical Stress in a Dielectric Solid From a Uniform Electric Field", *The American Physical Society*, 1986, pp. 1302-1307.

Aramaki, S., S. Kaneko, K. Arai, Y. Takahashi, H. Adachi, and K. Yanagisawa. 1995. "Tube Type Micro Manipulator Using Shape Memory Alloy (SMA)," *Proceedings of the IEEE Sixth International Symposium on Micro Machine and Human Science*, Nagoya, Japan, pp. 115-120.

Ashley, S., "Smart Skis and Other Adaptive Structures", *Mechanical Engineering*, Nov. 1995, pp. 77-81.

Bar-Cohen, Yoseph, JPL, *WorldWide Electroactive Polymer Actuators Webhub* webpages 1-7, http://ndeaa.jpl.nasa.gov/nasa-nde/lommas/eap/EAP-web.htm, downloaded Jul. 23, 2001.

Bar-Cohen, Yoseph, JPL, *WorldWide ElectroActive Polymers, EAP (Artificial Muscles) Newsletter*, vol. 1, No. 1, Jun. 1999.

Bar-Cohen, Yoseph, JPL, *WorldWide ElectroActive Polymers, EAP (Artificial Muscles) Newsletter*, vol. 1, No. 2, Dec. 1999.

Bar-Cohen, Yoseph, JPL, *WorldWide ElectroActive Polymers, EAP (Artificial Muscles) Newsletter*, vol. 2, No. 1, Jul. 2000.

Bar-Cohen, Yoseph, JPL, *WorldWide ElectroActive Polymers, EAP (Artificial Muscles) Newsletter*, vol. 2, No. 2, Dec. 2000.

Bar-Cohen, Yoseph, JPL, *WorldWide ElectroActive Polymers, EAP (Artificial Muscles) Newsletter*, vol. 3, No. 1, Jun. 2001.

Baughman, R., L. Shacklette, R. Elsenbaumer, E. Plichta, and C. Becht "Conducting Polymer Electromechanical Actuators," *Conjugated Polymeric Materials: Opportunities in Electronics, Optoelectronics and Molecular Electronics*, eds. J.L. Bredas and R.R. Chance, Kluwer Academic Publishers, The Netherlands, pp. 559-582, 1990.

Baughman, R.H., L.W. Shacklette, and R.L. Elsenbaumer, E.J. Plichta, and C. Becht, "Micro electromechanical actuators based on conducting polymers", in *Molecular Electronics, Materials and Methods*, P.I. Lazarev (ed.), Kluwer Academic Publishers, pp. 267-289 (1991).

Bharti, V., H. S. Xu, G. Shanthi, and Q. M. Zhang, "Polarization and Structural Properties of High Energy Electron Irradiated Poly(vinylidene fluoride-trifluoroethylene) Copolymer Films," to be published in J. Appl. Phys. (2000).

Bharti, V., X.-Z. Zhao, Q. M. Zhang, T. Romotowski, F. Tito, and R. Ting, "Ultrahigh Field Induced Strain And Polarization Response In Electron Irradiated Poly(Vinylidene Fluoride-Trifluoroethylene) Copolymer," *Mat. Res. Innovat*. vol. 2, 57-63 (1998).

Bharti, V., Y. Ye, T.-B. Xu and Q. M. Zhang, "Correlation Between Large Electrostrictive Strain and Relaxor Behavior with Structural Changes Induced in P(VDF-TrFE) Copolymer by electron Irradiation," Mat. Res. Soc. Symp. Proc. vol. 541, pp. 653-659 (1999).

Bharti, V., Z.-Y. Cheng, S. Gross, T.-B. Xu, and Q. M. Zhang, "High electrostrictive strain under high mechanical stress in electron-irradiated poly(vinylidene fluoride-trifluoroethylene) copolymer," *Appl. Phys. Lett.* vol. 75, 2653-2655 (Oct. 25, 1999).

Bobbio, S., M Kellam, B. Dudley, S. Goodwin Johansson, S. Jones, J. Jacobson, F. Tranjan, and T. DuBois, "Integrated Force Arrays," in Proc. IEEE Micro ElectroMechanical Systems Workshop, Fort Lauderdale, Florida Feb. 1993.

Bohon, K., and S. Krause, "An Electrorheological Fluid and Siloxane Gel Based Electromechanical Actuator: Working Toward an Artificial Muscle," to be published in *J. Polymer Sci., Part B. Polymer Phys.* (2000).

Brock, D. L., "Review of Artificial Muscle based on Contractile Polymers," MIT Artificial Intelligence Laboratory, A.I. Memo No. 1330, Nov. 1991.

Caldwell, D., G. Medrano-Cerda, and M. Goodwin, "Characteristics and Adaptive Control of Pneumatic Muscle Actuators for a Robotic Elbow," Proc. IEEE Int. Conference on Robotics and Automation, San Diego, California (May 8-13, 1994).

Calvert, P. and Z. Liu, "Electrically stimulated bilayer hydrogels as muscles," Proceedings of the SPIE International Symposium on Smart Structures and Materials: Electro-Active Polymer Actuators and Devices, Mar. 1-2, 1999, Newport Beach, California, USA, pp. 236-241.

Cheng, Z.-Y., H. S. Xu, J. Su, Q. M. Zhjang, P.-C. Wang, and A. G. MacDiarmid, "High performance of all-polymer electrostrictive systems," Proceedings of the SPIE International Symposium on Smart Structures and Materials: Electro-Active Polymer Actuators and Devices, Mar. 1-2, 1999, Newport Beach, California, USA., pp. 140-148.

Cheng, Z.-Y., T.-B. Xu, V. Bharti, S. Wang, and Q. M. Zhang, "Transverse Strain Responses In The Electrostrictive Poly(Vinylidene Fluoride-Trifluorethylene) Copolymer," *Appl. Phys. Lett.* vol. 74, No. 13, pp. 1901-1903, Mar. 29, 1999.

Chiarelli, P., A. Della Santa, D. DeRossi, and A. Mazzoldi. 1995. "Actuation Properties of Electrochemically Driven Polypyrrole Freestanding Films," *Journal of Intelligent Material Systems and Structures*, vol. 6, pp. 32-37, Jan. 1995.

De Rossi, D., and P. Chiarelli. 1994. "Biomimetic Macromolecular Actuators," *Macro-Ion Characterization, American Chemical Society Symposium Series*, vol. 548, Ch. 40, pp. 517-530.

Dowling, K., *Beyond Faraday-Non Traditional Actuation*, available on the World Wide Web at http://www.frc.ri.cmu.edu/~nivek/OTH/beyond-faraday/beyondfaraday.html, 9 pages, 1994.

Egawa, S. and T. Higuchi, "Multi-Layered Electrostatic Film Actuator," Proc. IEEE Micro Electra Mechanical Systems, Napa Valley, California, pp. 166-171 (Feb. 11-14, 1990).

Elhami, K., and B. Gauthier-Manual, "Electrostriction Of The Copolymer Of Vinylidene-Fluoride And Trifluoroethylene," *J. Appl. Phys.* vol. 77 (8), 3987-3990, Apr. 15, 1995.

Flynn, Anita M., L.S. Tavrow, S.F. Bart, R.A. Brooks, D.J. Ehrlich, K.R. Udayakumar, and L.E. Cross. 1992. "Piezoelectric Micromotors for Microrobots," *IEEE Journal of Microelectromechanical Systems*, vol. 1, No. 1, pp. 44-51 (Mar. 1992); also published as *MIT AI Laboratory Memo 1269*, Massachusetts Institute of Technology (Feb. 1991).

Full, R. J. and K. Meijer, "Artificial Muscles Versus Natural Actuators From Frogs To Flies," Proceedings of the 7th SPIE Symposium on Smart Structures and Materials-Electroactive Polymers and Devices (EAPAD) Conference, Mar. 6-8, 2000, Newport Beach, California, USA, pp. 2-9.

Furuhata, T., T. Hirano, and H. Fujita, "Array-Driven Ultrasonic Microactuators," Solid State Sensors and Actuators, 1991, Digest of Tech. Papers, Transducers, pp. 1056-1059.

Furukawa, T., and N. Seo., "Electrostriction as the Origin of Piezoelectricity in Ferroelectric Polymers," *Japanese J. Applied Physics*, vol. 29, No. 4, pp. 675-680 (Apr. 1990).

Gilbertson, R.G., and J.D. Busch. 1994. "Survey of Micro-Actuator Technologies for Future Spacecraft Missions," presented at the conference entitled "Practical Robotic Interstellar Flight: Are We Ready?" New York University and The United Nations, New York.

(Aug. 29 and Sep. 1, 1994 ); also published on the World Wide Web at http://nonothinc.com/nanosci/microtech/mems/ten-actuators/gilbertson.html.

Goldberg, Lee, Adaptive-Filtering Developments Extend Noise-Cancellation Applications, *Electronic Design*, Feb. 6, 1995, pp. 34 and 36.

Heydt, R., R. Kornbluh, R. Pelrine, and B. Mason, "Design and Performance of an Electrostrictive Polymer Film Acoustic Actuator", *Journal of Sound and Vibration* (1998)215(2), 297-311.

Heydt, R., R. Pelrine, J. Joseph, J. Eckerle, and R. Kornbluh. "Acoustical Performance of an Electrostrictive Polymer Film Loudspeaker", *Journal of the Acoustical Society of America* vol. 107, pp. 833-839 (Feb. 2000).

Hirano, M., K. Yanagisawa, H. Kuwano, and S. Nakano, "Microvalve with Ultra-low Leakage," Tenth Annual International Workshop on Micro Electromechanical Systems, Nagoya, Japan, *IEEE Proceedings* (Jan. 26-30, 1997), pp. 323-326.

Hirose, S., Biologically Inspired Robots: Snake-like Locomotors and Manipulators, "*Development of the ACM as a Manipulator*", Oxford University Press, New York, 1993, pp. 170-172.

Hunter, I., S. Lafontaine, J. Hollerbach, and P. Hunter, "Fast Reversible NiTi Fibers for Use in MicroRobotics," *Proc. 1991 IEEE Micro Electro Mechanical Systems—MEMS '91*, Nara, Japan, pp. 166-170.

Hunter, I.W., and S. Lafontaine, "A Comparison of Muscle with Artificial Actuators", *Technical Digest of the IEEE Solid-state Sensor and Actuator Workshop*, Hilton Head, South Carolina, Jun. 22-25, 1992, pp. 178-185.

Jacobsen, S., Price, R., Wood, J, Rytting, T., and Rafaelof, M., "A Design Overview of an Eccentric-Motion Electrostatic Microactuator (the Wobble Motor)", *Sensors and Actuators*, 20 (1989) pp. 1-16.

Kaneto, K., M. Kaneko, Y. Min, and A.G. MacDiarmid. 1995. "'Artificial Muscle': Electromechanical Actuators Using Polyaniline Films," *Synthetic Metals 71*, pp. 2211-2212, 1995.

Kawamura, S., K. Minani, and M. Esashi, "Fundamental Research of Distributed Electrostatic Micro Actuator," Technical Digest of the 11th Sensor Symposium, pp. 27-30(1992).

Kondoh Y., and T. Ono. 1991. "Bimorph Type Actuators using Lead Zinc Niobate-based Ceramics," *Japanese Journal of Applied Physics*, vol. 30, No. 9B, pp. 2260-2263, Sep. 1991.

Kornbluh, R. D and R. E. Pelrine., "Dexterous Multiarticulated Manipulator with Electrostrictive Polymer Artificial Muscle," ITAD-7247-QR-96-175, SRI Project No. 7247, Prepared for: Office of Naval Research, Nov. 1996.

Kornbluh, R., G. Andeen, and J. Eckerle, "Artificial Muscle: The Next Generation of Robotic Actuators," presented at the Fourth World Conference on Robotics Research, SME Paper M591-331, Pittsburgh, PA, Sep. 17-19, 1991.

Kornbluh, R., Pelrine, R. Joseph, J., Pei, Q. and Chiba, S., "Ultra-High Strain Response of Elastomeric Polymer Dielectrics", Proc. Materials Res. Soc., Fall meeting, Boston, MA, pp. 1-12, Dec. 1999.

Kornbluh, R., Pelrine, R., Eckerie, J., Joseph, J., "Electrostrictive Polymer Artificial Muscle Actuators", IEEE International Conference on Robotics and Automation, Leuven, Belgium, 1998.

Kornbluh, R., R. Pelrine, J. Joseph, "Elastomeric Dielectric Artificial Muscle Actuators for Small Robots," *Proceedings of the Third IASTED International Conference on Robotics and Manufacturing*, Jun. 14-16, 1995, Cancun, Mexico.

Kornbluh, R., R. Pelrine, Jose Joseph, Richard Heydt, Qibing Pei, Seiki Chiba, 1999. "High-Field Electrostriction Of Elastomeric Polymer Dielectrics For Actuation", Proceedings of the SPIE International Symposium on Smart Structures and Materials: Electro-Active Polymer Actuators and Devices, Mar. 1-2, 1999, Newport Beach, California, USA. pp. 149-161.

Kornbluh, R., R. Pelrine, Q. Pei, S. Oh, and J. Joseph, 2000. "Ultrahigh Strain Response of Field-Actuated Elastomeric Polymers," Proceedings of the 7th SPIE Symposium on Smart Structures and Materials-Electroactive Polymers and Devices (EAPAD) Conference, Mar. 6-8, 2000, Newport Beach, California, USA, pp. 51-64.

Kornbluh, R., R. Pelrine, R. Heydt, and Q. Pei, "Acoustic Actuators Based on the Field-Activated Deformation of Dielectric Elastomers," (2000).

Ktech's PVDF Sensors, http://www.ktech.com/pvdf.htm, Jun. 6, 2001, pp. 1-5.

Lang, J, M. Schlect, and R. Howe, "Electric Micromotors: Electromechanical Characteristics," Proc. IEEE Micro Robots and Teleoperators Workshop, Hyannis, Massachusetts (Nov. 9-11, 1987).

Lawless, W. and R. Arenz, "Miniature Solid-state Gas Compressor," Rev. Sci. Instrum., 58(8), pp. 1487-1493, Aug. 1987.

Liu, C., Y. Bar-Cohen, and S. Leary, "Electro-statically stricted polymers (ESSP)," Proceedings of the SPIE International Symposium on Smart Structures and Materials: Electro-Active Polymer Actuators and Devices, Mar. 1-2, 1999, Newport Beach, California, USA., pp. 186-190.

Liu, Y., T. Zeng, Y.X. Wang, H. Yu, and R. Claus, "Self-Assembled Flexible Electrodes on Electroactive Polymer Actuators," Proceedings of the SPIE International Symposium on Smart Structures and Materials: Electro-Active Polymer Actuators and Devices, Mar. 1-2, 1999, Newport Beach, California, USA., pp. 284-288.

M. Greene and J. A. Willett, and Kornbluh, R., "Robotic systems," in ONR Report 32198-2, Ocean Engineering and Marine Systems 1997 Program (Dec. 1997).

Martin, J. and R. Anderson, 1999. "Electrostriction In Field-Structured Composites: Basis For A Fast Artificial Muscle?", Journal of Chemical Physics, vol. 111, No. 9, pp. 4273-4280, Sep. 1, 1999.

Measurements Specialties, Inc.—Piezo Home, http://www.msiusa.com/piezo/index.htm, Jun. 6, 2001.

Nguyen, T., Green, M., and Kornbluh, R., "Robotic Systems," in ONR Ocean, Atmosphere, and Space Fiscal Year 1999 Annual Reports (Dec. 1999).

Nguyen, T., J. A. Willett and Kornbluh, R., "Robotic systems," in ONR Ocean, Atmosphere, and Space Fiscal Year 1998 Annual Reports (Dec. 1998).

Ohara, K., M. Hennecke, and J. Fuhrmann, "Electrostriction of polymethylmethacrylates," Colloid & Polymer Sci. vol. 280, 164-168 (1982).

Olsson, A., G. Stemme, and E. Stemme, "The First Valve-less Diffuser Gas Pump," Tenth Annual International Workshop on Micro Electromechanical Systems, Nagoya, Japan, IEEE Proceedings (Jan. 26-30, 1997), pp. 108-113.

Olsson, A., O. Larsson, J. Holm, L. Lundbladh, O. Ohinan, and G. Stemme. 1997. "Valve-less Diffuser Micropumps Fabricated using Thermoplastic Replication," Proc. IEEE Micro Electro Mechanical Systems, Nagoya, Japan, pp. 305-310 (Jan. 26-30, 1997).

Otero, T.F., J. Rodriguez, and C. Santamaria, "Smart Muscle Under Electrochemical Control of Molecular Movement in Polypyrrole Films," Materials Research Society Symposium Proceedings, vol. 330, pp. 333-338, 1994.

Otero, T.F., J. Rodriguez, E. Angulo and C. Santamaria, "Artificial Muscles from Bilayer Structures," Synthetic Metals, vol. 55-57, pp. 3713-3717 (1993).

Park, S.E., and T. Shrout., "Ultrahigh Strain and Piezoelectric Behavior in Relaxor Based Ferroelectric Single Crystals," J Applied Physics, vol. 82, pp. 1804-1811, Aug. 15, 1997.

Pei, Q., O. Inganäs, and I. Lundström, "Bending Bilayer Strips Built From Polyaniline For Artificial Electrochemical Muscles," Smart Materials and Structures, vol. 2, pp. 16., Jan. 22, 1993.

Pelrine R. E., et al.: "Electrostriction of Polymer Dielectrics with Compliant Electrodes As A Means of Actuation", Sensors and Actuators A., Elsevier Sequoia S.A., Lausanne, Ch, vol. 64, No. 1, 1998, pp. 77-85, XP004102141, ISSN: 0924-4247.

Pelrine, R, R. Kornbluh, J. Joseph, and S. Chiba, "Electrostriction of Polymer Films for Microactuators," Proc. IEEE Tenth Annual International Workshop on Micro Electro Mechanical Systems, Nagoya, Japan, Jan. 26-30, 1997, pp. 238-243.

Pelrine, R., and J. Joseph, FY 1992 Final Report on Artificial Muscle for Small Robots, ITAD-3393-FR-93-063, SRI International, Menlo Park, California, Mar. 1993.

Pelrine, R., and J. Joseph. 1994. FY 1993 Final Report on Artificial Muscle for Small Robots, ITAD-4570-FR-94-076, SRI International, Menlo Park, California.

Pelrine, R., J. Eckerle, and S. Chiba, "Review of Artificial Muscle Approaches," invited paper, in Proc. Third International Symposium on Micro Machine and Human Science, Nagoya, Japan, Oct. 14-16, 1992.

Pelrine, R., R. Kornbluh, and G. Kofod, "High Strain Actuator Materials Based on Dielectric Elastomers," submitted to Advanced Materials (May 2000).

Pelrine, R., R. Kornbluh, and J. Joseph, FY 1996 Final Report on Artificial Muscle for Small Robots, ITAD-7228-FR-97-058, SRI International, Menlo Park, California, 1997.

Pelrine, R., R. Kornbluh, and J. Joseph, FY 1997 Final Report on Artificial Muscle for Small Robots, ITAD-1612-FR-98-041, SRI International, Menlo Park, California, 1998.

Pelrine, R., R. Kornbluh, and J. Joseph, FY 1998 Final Report on Artificial Muscle for Small Robots, ITAD-3482-FR-99-36, SRI International, Menlo Park, California, 1999.

Pelrine, R., R. Kornbluh, and J. Joseph, FY 1999 Final Report on Artificial Muscle for Small Robots, ITAD-10162-FR-00-27, SRI International, Menlo Park, California, 2000.

Pelrine, R., R. Kornbluh, and J. Joseph, "Electrostriction of Polymer Dielectrics with Compliant Electrodes as a Means of Actuation," Sensors and Actuators A: Physical, vol. 64, 1998, pp. 77-85.

Pelrine, R., R. Kornbluh, and J. Joseph, FY 1994 Final Report on Artificial Muscle for Small Robots, ITAD-5782-FR-95-050, SRI International, Menlo Park, California, 1995.

Pelrine, R., R. Kornbluh, and J. Joseph, FY 1995 Final Report on Artificial Muscle for Small Robots, ITAD-7071 -FR-96-047, SRI International, Menlo Park, California, 1996.

Pelrine, R., R. Kornbluh, Q. Pei, and J. Joseph, "High Speed Electrically Actuated Elastomers with Over 100% Strain," Science, vol. 287, No. 5454, pp. 1-21, 2000.

Pelrine, R., R. Kornbluh, Q. Pei, and J. Joseph. "High-Speed Electrically Actuated Elastomers with Strain Greater Than 100%", Science, Reprint Series, Feb. 4, 2000, vol. 287, pp. 836-839.

Pelrine, R., Roy Kornbluh, Jose Joseph, Qibing Pei, Seiki Chiba "Recent Progress in Artificial Muscle Micro Actuators,", SRI International, Tokyo, 1999 MITI/NEEDOIMNIC, 1999.

Piezoflex™ PVDF Polymer Sensors, http://www.airmar.com/piezo/pvdf.htm, Jun. 6, 2001.

R. Pelrine and Kornbluh, R., and. 1995. "Dexterous Multiarticulated Manipulator with Electrostrictive Polymer Artificial Muscle Actuator," EMU 95-023, SRI International, Menlo Park, California, Apr. 28, 1995.

Ron Pelrine, Roy Kornbluh, Qibing Pei, Jose Joseph: "High-Speed ElectricallyActuated Elastomers With Strain Greater Than 100%" Science, vol. 287, Feb. 4, 2000, pp. 836-839, XP002288990, USA.

Scheinbeim, J., B. Newman, Z. Ma, and J. Lee, "Electrostrictive Response of Elastomeric Polymers," ACS Polymer Preprints, 33(2), pp. 385-386, 1992.

Schlaberg, H. I., and J. S. Duffy, "Piezoelectric Polymer Composite Arrays For Ultrasonic Medical Imaging Applications," Sensors and Actuators, A 44, pp. 111-117, Feb. 22, 1994.

Shahinpoor, M., "Micro-electro-mechanics of Ionic Polymer Gels as Electrically Controllable Artificial Muscles," J. Intelligent Material Systems and Structures, vol. 6, pp. 307-314, May 1995.

Shkel, Y., and D. Klingenberg, "Material Parameters for Electrostriction," J Applied Physics, vol. 80(8), pp. 4566-4572, Oct. 15, 1996.

Smela, E., O. Inganäs, and I. Lundström, "Controlled Folding of Micrometer-size Structures," Science, vol. 268, pp. 1735-1738 (Jun. 23, 1995).

Smela, E., O. Inganäs, Q. Pei, and I. Lundström, "Electrochemical Muscles: Micromachining Fingers and Corkscrews," Advanced Materials, vol. 5, No. 9, pp. 630-632, Sep. 1993.

Su, J., Q. M. Zhang, C. H. Kim, R. Y. Ting, and R. Capps, "Effects of Transitional Phenomena on the Electric Field induced Strain-electrostrictive Response of a Segmented Polyurethane Elastomer," pp. 1363-1370, Jan. 20, 1997.

Su, J., Z. Ounaies, J. S. Harrison, Y. Bara-Cohen and S. Leary, "Electromechanically Active Polymer Blends for Actuation," Proceedings of the 7th SPIE Symposium on Smart Structures and Materials-Electroactive Polymers and Devices (EAPAD) Conference, Mar. 6-8, 2000, Newport Beach, California, USA, pp. 65-72.

T. B. Nguyen, C. K. DeBolt, Shastri, S. V., and A. Mann, "Advanced Robotic Search," in ONR Ocean, Atmosphere, and Space Fiscal Year 1999 Annual Reports (Dec. 1999).

Technology, http://www.micromuscle.com/html/technology.html, Jun. 6, 2001.

Tobushi, H., S. Hayashi, and S. Kojima, "Mechanical Properties of Shape Memory Polymer of Polyurethane Series," in *JSME International Journal*, Series I, vol. 35, No. 3, 1992.

Treloar, L.R.G, "Mechanics of Rubber Elasticity," *J Polymer Science, Polymer Symposium*, No. 48, pp. 107-123, 1974.

Uchino, K. 1986. "Electrostrictive Actuators: Materials and Applications," *Ceramic Bulletin*, 65(4), pp. 647-652, 1986.

Wade, W. L., Jr., R. J. Mammone and M. Binder, "Increased Dielectric Breakdown Strengths Of Melt-Extruded Polyporpylene Films," *Polymer*, vol. 34, No. 5, pp. 1093-1094 (1993).

Wax, S. G. and R. R. Sands, "Electroactive Polymer Actuators and Devices," Proceedings of the SPIE International Symposium on Smart Structures and Materials: Electro-Active Polymer Actuators and Devices, Mar. 1-2, 1999, Newport Beach, California, USA., pp. 2-10.

Winters, J., "Muscle as an Actuator for Intelligent Robots", Robotics Research: Trans. Robotics International of SME, Scottsdale, AZ (Aug. 18-21, 1986).

Yam, P., "Plastics Get Wired", *Scientific American*, vol. 273, pp. 82-87, Jul. 1995.

Zhang, Q. M., V. Bharti, Z.-Y. Cheng, T.-B. Xu, S. Wang, T. S. Ramotowski, F. Tito, and R. Ting, "Electromechanical Behavior of Electroactive P(VDF-TrFE) Copolymers," Proceedings of the SPIE International Symposium on Smart Structures and Materials: Electro-Active Polymer Actuators and Devices, Mar. 1-2, 1999, Newport Beach, California, USA., pp. 134-139.

Zhang, Q. M., Z.-Y. Cheng, V. Bharti, T.-B. Xu, H. Xu, T. Mai, and S. J. Gross, "Piezoelectric And Electrostrictive Polymeric Actuator Materials," Proceedings of the 7th SPIE Symposium on Smart Structures and Materials-Electroactive Polymers and Devices (EAPAD) Conference, Mar. 6-8, 2000, Newport Beach, California, USA, pp. 34-50.

Zhang, Q., V. Bharti, and X. Zhao, "Giant Electrostriction and Relaxor Ferroelectric Behavior in Electron-irradiated Poly(vinylidene fluoride-trifluoroethylene) Copolymer," *Science*, vol. 280, pp. 2101-2104 (Jun. 26, 1998).

Zhenyi, M., J.I. Scheinbeim, J.W. Lee, and B.A. Newman. 1994. "High Field Electrostrictive Response of Polymers," *Journal of Polymer Sciences, Part B-Polymer Physics*, vol. 32, pp. 2721-2731, 1994.

Puers et al, "A Capacitive Pressure Sensor with Low Impedance Output and Active Suppression of Parasitic Effects," Sensors and Actuators, A21-A23 (1990) 108-114.

Robert Puers, "Capacitive sensors: when and how to use them," Sensors and Actuators A, 37-38 (1993) 93-105.

Seoul et al., "Electrospinning of Poly(vinylidene fluoride). Dimethylformamide Solutions with Carbon Nanotubes," Department of Textile Engineering, Inha University, Mar. 31, 2003.

\* cited by examiner

ELECTROACTIVE POLYMER ELECTRODES

CROSS-REFERENCE TO RELATED APPLICATIONS

This application is a divisional of and claims priority under U.S.C. §120 from co-pending U.S. patent application Ser. No. 11/335,805, filed Jan. 18, 2006, which is incorporated herein for all purposes; the Ser. No. 11/335,805 patent application is a continuation application and claimed priority under U.S.C. §120 from U.S. patent application Ser. No. 10/893,730, filed Jul. 16, 2004, now U.S. Pat. No. 7,049,732, issued May 23, 2006, which is incorporated herein for all purposes; the Ser. No. 10/893,730 patent application is a divisional application of and claimed priority under U.S.C. §120 from U.S. patent application Ser. No. 09/619,847, filed Jul. 20, 2000, now U.S. Pat. No. 6,812,624 B1, issued Nov. 2, 2004, which is incorporated herein for all purposes; the U.S. Pat. No. 6,812,624 B1 patent claimed priority under 35 U.S.C. § 119(e) from i) U.S. Provisional Patent Application No. 60/144,556 filed Jul. 20, 1999, naming R. E. Pelrine et al. as inventors, and titled "High-speed Electrically Actuated Polymers and Method of Use", which is incorporated by reference herein for all purposes, ii) U.S. Provisional Patent Application No. 60/153,329 filed Sep. 10, 1999, naming R. E. Pelrine et al. as inventors, and titled "Electrostrictive Polymers As Microactuators", which is incorporated by reference herein for all purposes, iii) U.S. Provisional Patent Application No. 60/161,325 filed Oct. 25, 1999, naming R. E. Pelrine et al. as inventors, and titled "Artificial Muscle Microactuators", which is incorporated by reference herein for all purposes, iv) U.S. Provisional Patent Application No. 60/181,404 filed Feb. 9, 2000, naming R. D. Kornbluh et al. as inventors, and titled "Field Actuated Elastomeric Polymers", which is incorporated by reference herein for all purposes, v) U.S. Provisional Patent Application No. 60/187,809 filed Mar. 8, 2000, naming R. E. Pelrine et al. as inventors, and titled "Polymer Actuators and Materials", which is incorporated by reference herein for all purposes; vi) U.S. Provisional Patent Application No. 60/192,237 filed Mar. 27, 2000, naming R. D. Kornbluh et al. as inventors, and titled "Polymer Actuators and Materials II", which is incorporated by reference herein for all purposes, and vii) U.S. Provisional Patent Application No. 60/184,217 filed Feb. 23, 2000, naming R. E. Pelrine et al. as inventors, and titled "Electroelastomers and their use for Power Generation", which is incorporated by reference herein for all purposes.

U.S. GOVERNMENT RIGHTS

This application was made in part with government support under contract number N00014-96-C-0026 awarded by the Office of Naval Research; this application was also made in part with government support under contract number DAAG55-98-K-001 awarded by the United States Army Research Office and Defense Advanced Research Project Agency. The government has certain rights in the invention.

BACKGROUND OF THE INVENTION

The present invention relates generally to electroactive polymers that convert between electrical energy and mechanical energy. More particularly, the present invention relates to polymers and their use as generators, sensors, in actuators and various applications. The present invention also relates to additives added to a polymer, laminates comprising a transducer and methods of fabricating a transducer.

In many applications, it is desirable to convert between electrical energy and mechanical energy. Exemplary applications requiring translation from electrical to mechanical energy include robotics, pumps, speakers, general automation, disk drives and prosthetic devices. These applications include one or more actuators that convert electrical energy into mechanical work—on a macroscopic or microscopic level. Common electric actuator technologies, such as electromagnetic motors and solenoids, are not suitable for many of these applications, e.g., when the required device size is small (e.g., micro or mesoscale machines). Exemplary applications requiring translation from mechanical to electrical energy include mechanical property sensors and heel strike generators. These applications include one or more transducers that convert mechanical energy into electrical energy. Common electric generator technologies, such as electromagnetic generators, are also not suitable for many of these applications, e.g., when the required device size is small (e.g., in a person's shoe). These technologies are also not ideal when a large number of devices must be integrated into a single structure or under various performance conditions such as when high power density output is required at relatively low frequencies.

Several 'smart materials' have been used to convert between electrical and mechanical energy with limited success. These smart materials include piezoelectric ceramics, shape memory alloys and magnetostrictive materials. However, each smart material has a number of limitations that prevent its broad usage. Certain piezoelectric ceramics, such as lead zirconium titanate (PZT), have been used to convert electrical to mechanical energy. While having suitable efficiency for a few applications, these piezoelectric ceramics are typically limited to a strain below about 1.6 percent and are often not suitable for applications requiring greater strains than this. In addition, the high density of these materials often eliminates them from applications requiring low weight. Irradiated polyvinylidene difluoride (PVDF) is an electroactive polymer reported to have a strain of up to 4 percent when converting from electrical to mechanical energy. Similar to the piezoelectric ceramics, the PVDF is often not suitable for applications requiring strains greater than 4 percent. Shape memory alloys, such as nitinol, are capable of large strains and force outputs. These shape memory alloys have been limited from broad use by unacceptable energy efficiency, poor response time and prohibitive cost.

In addition to the performance limitations of piezoelectric ceramics and irradiated PVDF, their fabrication often presents a barrier to acceptability. Single crystal piezoelectric ceramics must be grown at high temperatures coupled with a very slow cooling down process. Irradiated PVDF must be exposed to an electron beam for processing. Both these processes are expensive and complex and may limit acceptability of these materials.

In view of the foregoing, alternative devices that convert between electrical and mechanical energy would be desirable.

SUMMARY

In one aspect, the present invention relates to polymers that convert between electrical and mechanical energy. When a voltage is applied to electrodes contacting a pre-strained polymer, the polymer deflects. This deflection may be used to do mechanical work. Similarly, when the polymer deflects, an electric field is produced in the polymer. This electric field may be used to produce electrical energy. Some polymers of the present invention include additives that improve conversion between electrical and mechanical energy. Other polymers of the present invention include laminate layers that improve conversion between electrical and mechanical energy.

In another aspect, the present invention relates to compliant electrodes that conform to the changing shape of a polymer. Many of the electrodes are capable of maintaining electrical communication at the high deflections encountered with pre-strained polymers of the present invention. In some embodiments, electrode compliance may vary with direction.

These and other features and advantages of the present invention will be described in the following description of the invention and associated figures.

BRIEF DESCRIPTION OF THE DRAWINGS

FIG. 2I illustrates an inchworm-type actuator including a rolled electroactive polymer in accordance with one embodiment of the present invention.

DETAILED DESCRIPTION OF EMBODIMENTS

Figure 1A:
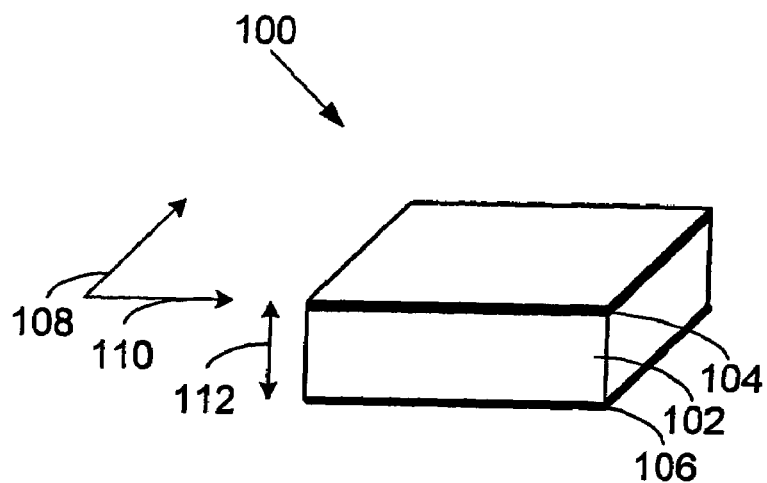
FIGS. 1A and 1B illustrate a top perspective view of a transducer before and after application of a voltage in accordance with one embodiment of the present invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Overview

Electroactive polymers deflect when actuated by electrical energy. In one embodiment, an electroactive polymer refers to a polymer that acts as an insulating dielectric between two electrodes and may deflect upon application of a voltage difference between the two electrodes. In one aspect, the present invention relates to polymers that are pre-strained to improve conversion between electrical and mechanical energy. The pre-strain improves the mechanical response of an electroactive polymer relative to a non-strained electroactive polymer. The improved mechanical response enables greater mechanical work for an electroactive polymer, e.g., larger deflections and actuation pressures. For example, linear strains of at least about 200 percent and area strains of at least about 300 percent are possible with pre-strained polymers of the present invention. The pre-strain may vary in different directions of a polymer. Combining directional variability of the pre-strain, different ways to constrain a polymer, scalability of electroactive polymers to both micro and macro levels, and different polymer orientations (e.g., rolling or stacking individual polymer layers) permits a broad range of actuators that convert electrical energy into mechanical work. These actuators find use in a wide range of applications.

For ease of understanding, the present invention is described and shown by focusing on a single direction of energy conversion. More specifically, the present invention focuses on converting electrical energy into mechanical energy. However, in all the figures and discussions for the present invention, it is important to note that the polymers and devices may convert between electrical energy and mechanical energy bi-directionally. Thus, any of the polymer materials, polymer configurations, transducers, devices and actuators described herein are also a transducer for converting mechanical energy to electrical energy (a generator) in the reverse direction. Similarly, any of the exemplary electrodes described herein may be used with a generator of the present invention. Typically, a generator includes a polymer arranged in a manner which causes a change in electric field in response to deflection of a portion of the polymer.

Thus, polymers and transducers of the present invention may be used as an actuator to convert from electrical to mechanical energy or a generator to convert from mechanical to electrical energy. For a transducer having a substantially constant thickness, one mechanism for differentiating the performance of the transducer as being an actuator or a generator is in the change in net area orthogonal to the thickness during use. For these transducers, when the net area of the transducer decreases, the transducer is acting as a generator. Conversely, when the net area of the transducer increases, the transducer is acting as an actuator.

As the electroactive polymers of the present invention may deflect at linear strains of at least about 200 percent, electrodes attached to the polymers should also deflect without compromising mechanical or electrical performance. Correspondingly, in another aspect, the present invention relates to compliant electrodes that conform to the shape of an electroactive polymer they are attached to. The electrodes are capable of maintaining electrical communication even at the high deflections encountered with pre-strained polymers of the present invention. By way of example, strains at least about 50 percent are common with electrodes of the present invention. In some embodiments, compliance provided by the electrodes may vary with direction.

As the pre-strained polymers are suitable for use in both the micro and macro scales, in a wide variety of actuators and in a broad range of applications, fabrication processes used with the present invention vary greatly. In another aspect, the present invention provides methods for fabricating electromechanical devices including one or more pre-strained polymers. Pre-strain may be achieved by a number of techniques such as mechanically stretching an electroactive polymer and fixing the polymer to one or more solid members while it is stretched.

General Structure of Devices

Figure 1B:
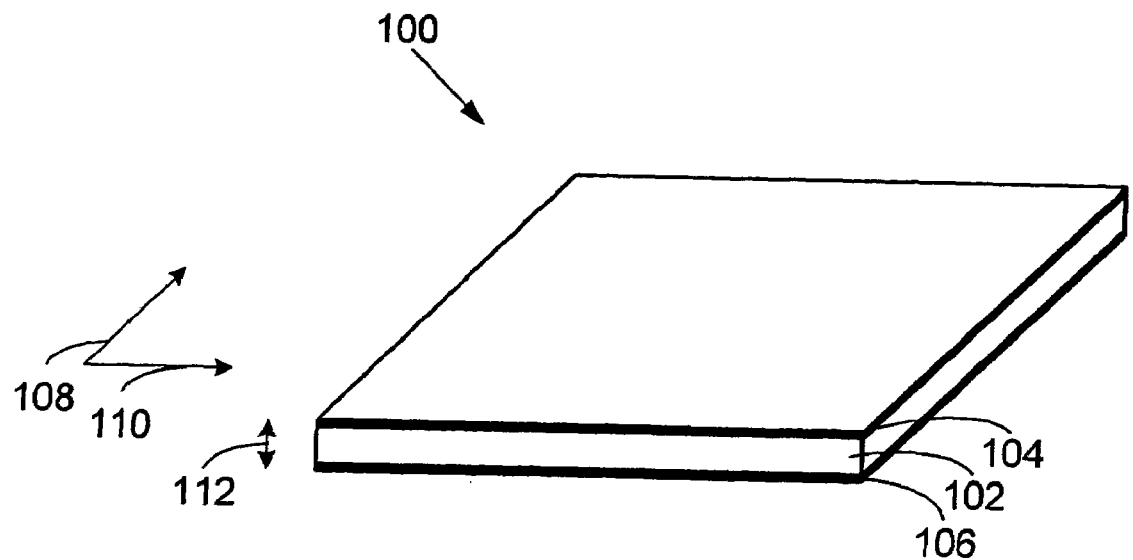

FIGS. 1A and 1B illustrate a top perspective view of a transducer 100 in accordance with one embodiment of the present invention. The transducer 100 includes a polymer 102 for converting between electrical energy and mechanical energy. Top and bottom electrodes 104 and 106 are attached to the electroactive polymer 102 on its top and bottom surfaces respectively to provide a voltage difference across a portion of the polymer 102. The polymer 102 deflects with a change in electric field provided by the top and bottom electrodes 104 and 106. Deflection of the transducer 100 in response to a change in electric field provided by the electrodes 104 and 106 is referred to as actuation. As the polymer 102 changes in size, the deflection may be used to produce mechanical work.

FIG. 1B illustrates a top perspective view of the transducer 100 including deflection in response to a change in electric field. Generally speaking, deflection refers to any displacement, expansion, contraction, torsion, linear or area strain, or any other deformation of a portion of the polymer 102. The change in electric field corresponding to the voltage difference produced by the electrodes 104 and 106 produces mechanical pressure within the pre-strained polymer 102. In this case, the unlike electrical charges produced by the electrodes 104 and 106 are attracted to each other and provide a compressive force between the electrodes 104 and 106 and an expansion force on the polymer 102 in planar directions 108 and 110, causing the polymer 102 to compress between the electrodes 104 and 106 and stretch in the planar directions 108 and 110.

In some cases, the electrodes 104 and 106 cover a limited portion of the polymer 102 relative to the total area of the polymer. This may done to prevent electrical breakdown around the edge of polymer 102 or to achieve customized deflections in certain portions of the polymer. As the term is used herein, an active region is defined as a portion of the polymer material 102 having sufficient electrostatic force to enable deflection of the portion. As will be described below, a polymer of the present invention may have multiple active regions. Polymer 102 material outside an active area may act as an external spring force on the active area during deflection. More specifically, material outside the active area may resist active area deflection by its contraction or expansion. Removal of the voltage difference and the induced charge causes the reverse effects.

The electrodes 104 and 106 are compliant and change shape with the polymer 102. The configuration of the polymer 102 and the electrodes 104 and 106 provides for increasing polymer 102 response with deflection. More specifically, as the transducer 100 deflects, compression of the polymer 102 brings the opposite charges of the electrodes 104 and 106 closer and stretching of the polymer 102 separates similar charges in each electrode. In one embodiment, one of the electrodes 104 and 106 is ground.

Generally speaking, the transducer 100 continues to deflect until mechanical forces balance the electrostatic forces driving the deflection. The mechanical forces include elastic restoring forces of the polymer 102 material, the compliance of the electrodes 104 and 106, and any external resistance provided by a device and/or load coupled to the transducer 100. The resultant deflection of the transducer 100 as a result of the applied voltage may also depend on a number of other factors such as the polymer 102 dielectric constant and the polymer 102 size.

Electroactive polymers in accordance with the present invention are capable of deflection in any direction. After application of the voltage between the electrodes 104 and 106, the electroactive polymer 102 increases in size in both planar directions 108 and 110. In some cases, the electroactive polymer 102 is incompressible, e.g. has a substantially constant volume under stress. In this case, the polymer 102 decreases in thickness as a result of the expansion in the planar directions 108 and 110. It should be noted that the present invention is not limited to incompressible polymers and deflection of the polymer 102 may not conform to such a simple relationship.

Application of a relatively large voltage difference between the electrodes 104 and 106 on the transducer 100 shown in FIG. 1A will cause transducer 100 to change to a thinner, larger area shape as shown in FIG. 1B. In this manner, the transducer 100 converts electrical energy to mechanical energy. The transducer 100 also converts mechanical energy to electrical energy.

FIGS. 1A and 1B may be used to show one manner in which the transducer 100 converts mechanical to electrical energy. For example, if the transducer 100 is mechanically stretched by external forces to a thinner, larger area shape such as that shown in FIG. 1B, and a relatively small voltage difference is applied between electrodes 104 and 106, when the external forces are removed the transducer 100 will contract in area between the electrodes to a shape such as in FIG. 1A. Stretching the transducer generally refers to deflecting the transducer from its original resting position—typically to have a larger net area between the electrodes, e.g. in the plane defined by directions 108 and 110 between the electrodes. The resting position refers to the position of the transducer 100 having no external electrical or mechanical input and may include any pre-strain in the polymer. Once the transducer 100 is stretched, the relatively small voltage difference is provided such that the resulting electrostatic forces are insufficient to balance the elastic restoring forces of the stretch. The transducer 100 therefore contracts, and it becomes thicker and has a smaller planar area in the plane defined by directions 108 and 110 (orthogonal to the thickness between electrodes). When the polymer 102 becomes thicker, it separates electrodes 104 and 106 and their corresponding unlike charges, thus raising the electrical energy of the charge. Further, when the electrodes 104 and 106 contract to a smaller area, like charges within each electrode compress, also raising the electrical energy of the charge. Thus, with different charges on the electrodes 104 and 106, contraction from a shape such as that shown in FIG. 1B to one such as that shown in FIG. 1A raises the electrical energy of the charge. That is, mechanical deflection is being turned into electrical energy and the transducer 100 is acting as a generator.

In some cases, the transducer 100 may be described electrically as a variable capacitor. The capacitance decreases for the shape change going from that shown in FIG. 1B to that shown in FIG. 1A. Typically, the voltage difference between electrodes 104 and 106 will be raised by contraction. This is normally the case, for example, if additional charge is not added or subtracted from the electrodes 104 and 106 during the contraction process. The increase in electrical energy, U, may be illustrated by the formula $U=0.5\, Q^2/C$, where Q is the amount of positive charge on the positive electrode and C is the variable capacitance which relates to the intrinsic dielectric properties of polymer 102 and its geometry. If Q is fixed and C decreases, then the electrical energy U increases. The increase in electrical energy and voltage can be recovered or used in a suitable device or electronic circuit in electrical communication with electrodes 104 and 106. In addition, the transducer 100 may be mechanically coupled to a mechanical input that deflects the polymer and provides mechanical energy.

The transducer 100 will convert mechanical energy to electrical energy when it contracts. Some or all of the charge and energy can be removed when the transducer 100 is fully contracted in the plane defined by directions 108 and 110, or charge and energy can be removed during contraction. If the electric field pressure increases and reaches balance with the elastic restoring stresses during contraction, the contraction will stop before full contraction, and no further elastic mechanical energy will be converted to electrical energy. Removing some of the charge and stored electrical energy reduces the electrical field pressure, thereby allowing contraction to continue and further converting more mechanical energy to electrical energy. The exact electrical behavior of the transducer 100 when operating as a generator depends on any electrical and mechanical loading as well as the intrinsic properties of the polymer 102 and electrodes 104 and 106.

The electroactive polymer 102 is pre-strained. Pre-strain of a polymer may be described in one or more directions as the change in dimension in that direction after pre-straining relative to the dimension in that direction before pre-straining. The pre-strain may comprise elastic deformation of the polymer 102 and be formed, for example, by stretching the polymer 102 in tension and fixing one or more of the edges while stretched. The pre-strain improves conversion between electrical and mechanical energy. In one embodiment, prestrain improves the dielectric strength of the polymer. For the transducer 100, the pre-strain allows the electroactive polymer 102 to deflect more and provide greater mechanical work when converting electrical to mechanical energy. For a generator, pre-strain allows more charge to be placed on the electrodes 104 and 106, thereby resulting in more generated electrical energy, e.g. in a cycle of the transducer 100 deflection. In one embodiment, the pre-strain is elastic. After actuation, an elastically pre-strained polymer could, in principle, be unfixed and return to its original state. The pre-strain may be imposed at the boundaries using a rigid frame or may be implemented locally for a portion of the polymer.

In one embodiment, pre-strain is applied uniformly over a portion of the polymer 102 to produce an isotropic pre-strained polymer. By way of example, an acrylic elastomeric polymer may be stretched by 200-400 percent in both planar directions. In another embodiment, pre-strain is applied unequally in different directions for a portion of the polymer 102 to produce an anisotropic pre-strained polymer. In this case, the polymer 102 may deflect greater in one direction than another when actuated. While not wishing to be bound by theory, it is believed that pre-straining a polymer in one direction may increase the stiffness of the polymer in the pre-strain direction. Correspondingly, the polymer is relatively stiffer in the high pre-strain direction and more compliant in the low pre-strain direction and, upon actuation, the majority of deflection occurs in the low pre-strain direction. In one embodiment, the transducer 100 enhances deflection in the direction 108 by exploiting large pre-strain in the perpendicular direction 110. By way of example, an acrylic elastomeric polymer used as the transducer 100 may be stretched by 100 percent in the direction 108 and by 500 percent in the perpendicular direction 110. Construction of the transducer 100 and geometric edge constraints may also affect directional deflection as will be described below with respect to actuators.

Anisotropic prestrain may also improve the performance of a transducer to convert mechanical to electrical energy in a generator mode. In addition to increasing the dielectric breakdown strength of the polymer and allowing more charge to be placed on the polymer, high pre-strain may improve mechanical to electrical coupling in the low pre-strain direction. That is, more of the mechanical input into the low pre-strain direction can be converted to electrical output, thus raising the efficiency of the generator.

The quantity of pre-strain for a polymer may be based on the electroactive polymer and the desired performance of the polymer in an actuator or application. For some polymers of the present invention, pre-strain in one or more directions may range from −100 percent to 600 percent. By way of example, for a VHB acrylic elastomer having isotropic pre-strain, pre-strains of at least about 100 percent, and preferably between about 200-400 percent, may be used in each direction. In one embodiment, the polymer is pre-strained by a factor in the range of about 1.5 times to 50 times the original area. For an anisotropic acrylic pre-strained to enhance actuation in a compliant direction, pre-strains between about 400-500 percent may be used in the stiffened direction and pre-strains between about 20-200 percent may be used in the compliant direction. In some cases, pre-strain may be added in one direction such that a negative pre-strain occurs in another direction, e.g. 600 percent in one direction coupled with −100 percent in an orthogonal direction. In these cases, the net change in area due to the pre-strain is typically positive.

Pre-strain may affect other properties of the polymer 102. Large pre-strains may change the elastic properties of the polymer and bring it into a stiffer regime with lower viscoelastic losses. For some polymers, pre-strain increases the electrical breakdown strength of the polymer 102, which allows for higher electric fields to be used within the polymer—permitting higher actuation pressures and higher deflections.

Linear strain and area strain may be used to describe the deflection of a pre-strained polymer. As the term is used herein, linear strain of a pre-strained polymer refers to the deflection per unit length along a line of deflection relative to the unactuated state. Maximum linear strains (tensile or compressive) of at least about 50 percent are common for pre-strained polymers of the present invention. Of course, a polymer may deflect with a strain less than the maximum, and the strain may be adjusted by adjusting the applied voltage. For some pre-strained polymers, maximum linear strains of at least about 100 percent are common. For polymers such as VHB 4910 as produced by 3M Corporation of St. Paul, Minn., maximum linear strains in the range of 40 to 215 percent are common. Area strain of an electroactive polymer refers to the change in planar area, e.g. the change in the plane defined by directions 108 and 110 in FIGS. 1A and 1B, per unit area of the polymer upon actuation relative to the unactuated state. Maximum area strains of at least about 100 percent are possible for pre-strained polymers of the present invention. For some pre-strained polymers, maximum area strains in the range of 70 to 330 percent are common.

Generally, after the polymer is pre-strained, it may be fixed to one or more objects. Each object may be suitably stiff to maintain the level of pre-strain desired in the polymer. The polymer may be fixed to the one or more objects according to any conventional method known in the art such as a chemical adhesive, an adhesive layer or material, mechanical attachment, etc.

Transducers and pre-strained polymers of the present invention are not limited to any particular geometry or linear deflection. For example, the polymer and electrodes may be formed into any geometry or shape including tubes and rolls, stretched polymers attached between multiple rigid structures, stretched polymers attached across a frame of any geometry—including curved or complex geometries, across a frame having one or more joints, etc. Deflection of a transducer according to the present invention includes linear expansion and compression in one or more directions, bending, axial deflection when the polymer is rolled, deflection out of a hole provided in a substrate, etc. Deflection of a transducer may be affected by how the polymer is constrained by a frame or rigid structures attached to the polymer. In one embodiment, a flexible material that is stiffer in elongation than the polymer is attached to one side of a transducer induces bending when the polymer is actuated. In another embodiment, a transducer that deflects out of the plane is referred to as a diaphragm. A diaphragm device for converting between electrical energy and mechanical energy will be described in more detail with respect to FIGS. 1E and 1F.

Transducers (including methods of using them and methods of fabricating them) in accordance with the present invention are described in reports available from the New Energy and Industrial Technology Development Organization (NEDO) offices under the reference title "Annual Research Progress Report for R&D of Micromachine Technology (R&D of High Functional Maintenance System for Power Plant Facilities)" for 1999, the "Annual Research Progress Report for R&D of Micromachine Technology (R&D of High Functional Maintenance System for Power Plant Facilities)" for 1998, the "Annual Research Progress Report for R&D of Micromachine Technology (R&D of High Functional Maintenance System for Power Plant Facilities)" for 1997, or the "Annual Research Progress Report for R&D of Micromachine Technology (R&D of High Functional Maintenance System for Power Plant Facilities)" for 1996, all of which are incorporated herein for all purposes. NEDO has several offices in Japan in addition to other offices in the United Sates, Australia, France, Thailand and China.

Figure 1C:
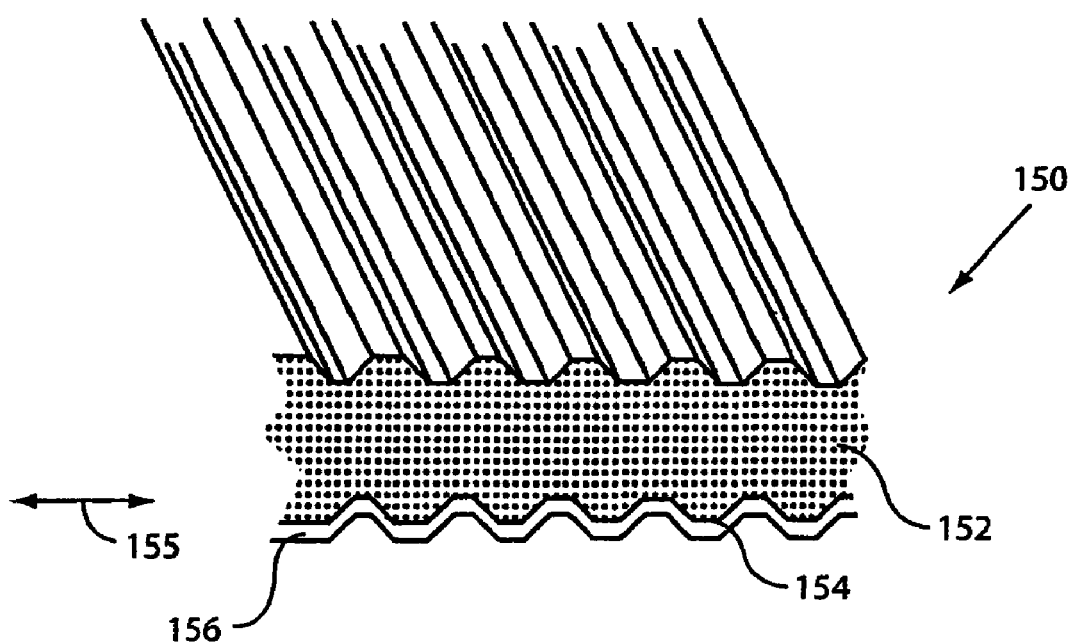
FIG. 1C illustrates a textured surface for an electroactive polymer having a wavelike profile.

Electroactive polymers in accordance with one embodiment of the present invention may include a textured surface. FIG. 1C illustrates a textured surface 150 for an electroactive polymer 152 having a wavelike profile. The textured surface 150 allows the polymer 152 to deflect using bending of surface waves 154. Bending of the surface waves 154 provides directional compliance in a direction 155 with less resistance than bulk stretching for a stiff electrode attached to the polymer 152 in the direction 155. The textured surface 150 may be characterized by troughs and crests, for example, about 0.1 micrometer to 40 micrometers wide and about 0.1 micrometers to 20 micrometers deep. In this case, the wave width and depth is substantially less than the thickness of the polymer. In a specific embodiment, the troughs and crests are approximately 10 micrometers wide and six micrometers deep on a polymer layer with a thickness of 200 micrometers.

In one embodiment, a thin layer of stiff material 156, such as an electrode, is attached to the polymer 152 to provide the wavelike profile. During fabrication, the electroactive polymer is stretched more than it can stretch when actuated, and the thin layer of stiff material 156 is attached to the stretched polymer 152 surface. Subsequently, the polymer 152 is relaxed and the structure buckles to provide the textured surface.

Figure 1D:
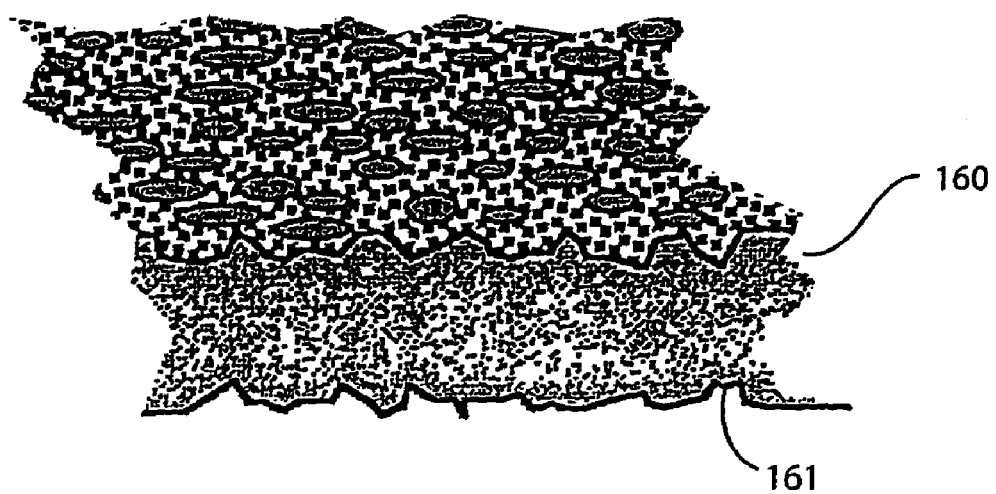
FIG. 1D illustrates an electroactive polymer including a textured surface having random texturing.

In general, a textured surface may comprise any non-uniform or non-smooth surface topography that allows a polymer to deflect using deformation in the polymer surface. By way of example, FIG. 1D illustrates an electroactive polymer 160 including a roughened surface 161 having random texturing. The roughened surface 160 allows for planar deflection that is not directionally compliant. Advantageously, deformation in surface topography may allow deflection of a stiff electrode with less resistance than bulk stretching or compression. It should be noted that deflection of a pre-strained polymer having a textured surface may comprise a combination of surface deformation and bulk stretching of the polymer.

Textured or non-uniform surfaces for the polymer may also allow the use of a barrier layer and/or electrodes that rely on deformation of the textured surfaces. The electrodes may include metals that bend according to the geometry of the polymer surface. The barrier layer may be used to block charge in the event of local electrical breakdown in the pre-strained polymer material.

Materials suitable for use as a pre-strained polymer with the present invention may include any substantially insulating polymer or rubber (or combination thereof) that deforms in response to an electrostatic force or whose deformation results in a change in electric field. One suitable material is NuSil CF19-2186 as provided by NuSil Technology of Carpenteria, Calif. More generally, exemplary materials suitable for use as a pre-strained polymer include silicone elastomers, acrylic elastomers, polyurethanes, thermoplastic elastomers, copolymers comprising PVDF, pressure-sensitive adhesives, fluoroelastomers, polymers comprising silicone and acrylic moieties, and the like. Polymers comprising silicone and acrylic moieties may include copolymers comprising silicone and acrylic moieties, polymer blends comprising a silicone elastomer and an acrylic elastomer, for example. Obviously, combinations of some of these materials may be used as the polymer in transducers of this invention.

One example of a suitable silicone elastomer is Dow Corning HS3 as provided by Dow Corning of Wilmington, Del. One example of a suitable fluorosilicone is Dow Corning 730 as provided by Dow Corning of Wilmington, Del. One suitable example of a thermoplastic elastomer is styrene butadiene styrene (SBS) block copolymer.

Some acrylics such as any acrylic in the 4900 VHB acrylic series as provided by 3M Corp. of St. Paul, Minn. have properties suitable for use as the transducer polymer for this invention. Thus, in some embodiments, polymers suitable for use with the present invention may be made from any monoethylenically unsaturated monomer (or combination of monomers) homopolymerizable to form a polymer having a glass transition temperature at most about 0 degrees Celsius. Preferred monoethylenically unsaturated monomers include isooctyl acrylate, 2-ethylhexyl acrylate, decyl acrylate, dodecyl acrylate, hexyl acrylate, isononyl acrylate, isooctyl methacrylate, and 2-ethylhexyl methacrylate. Any of the monomers may also include one or more halogens such as fluorine.

One example of a suitable copolymer includes both silicone and acrylic elastomer moieties. In some case, materials suitable for use with the present invention may contain combinations of one or more of the above listed materials. For example, one suitable polymer is a blend including a silicone elastomer and an acrylic elastomer.

In many cases, materials used in accordance with the present invention are commercially available polymers. The commercially available polymers may include, for example, any commercially available silicone elastomer, polyurethane, PVDF copolymer and adhesive elastomer. Using commercially available materials provides cost-effective alternatives for transducers and associated devices of the present invention. The use of commercially available materials may also simplify fabrication. In a specific embodiment, the commercially available polymer is a commercially available acrylic elastomer comprising mixtures of aliphatic acrylate that are photocured during fabrication. The elasticity of the acrylic elastomer results from a combination of the branched aliphatic groups and cross-linking between the acrylic polymer chains.

Materials used as a pre-strained polymer may be selected based on one or more material properties such as a high electrical breakdown strength, a low modulus of elasticity—(for large or small deformations), a high dielectric constant, etc. In one embodiment, the polymer is selected such that is has an elastic modulus at most about 100 MPa. In another embodiment, the polymer is selected such that is has a maximum actuation pressure between about 0.05 MPa and about 10 MPa, and preferably between about 0.3 MPa and about 3 MPa. In another embodiment, the polymer is selected such that is has a dielectric constant between about 2 and about 20, and preferably between about 2.5 and about 12. For some applications, an electroactive polymer is selected based on one or more application demands such as a wide temperature and/or humidity range, repeatability, accuracy, low creep, reliability and endurance. Often, halogenated polymers, such as fluorinated or chlorinated polymers, exhibit a higher dielectric constant than the base polymer. In one example, a high dielectric polyurethane may be made from partially fluorinated urethane monomers.

Electroactive polymers of the present invention may also include one or more additives to improve various properties. Examples of suitable classes of materials include plasticizers, antioxidants, and high dielectric constant particulates. Examples of suitable plasticizers include high molecular-weight hydrocarbon oils, high molecular-weight hydrocarbon greases, Pentalyne H, Piccovar® AP Hydrocarbon Resins, Admex 760, Plastolein 9720, silicone oils, silicone greases, Floral 105, silicone elastomers, nonionic surfactants, and the like. Of course, combinations of these materials may be used. In one embodiment, the antioxidant is a nonvolatile solid antioxidant.

In one preferred embodiment, the additives improve the ability of the polymer to convert between mechanical energy and electrical energy. Generally, the additive may improve any polymer property or parameter related to the ability of the parameter to convert between mechanical energy and electrical energy. Polymer material properties and parameters related to the ability of the polymer to convert between mechanical energy and electrical energy include, for example, the dielectric breakdown strength, maximum strain, dielectric constant, elastic modulus, properties associated with the visco-elastic performance, properties associated with creep, response time and actuation voltage. The addition of a plasticizer may, for example, improve the functioning of a transducer of this invention by reducing the elastic modulus of the polymer and/or increasing the dielectric breakdown strength of the polymer.

In one embodiment, an additive is included in a polymer to improve the dielectric breakdown strength of the polymer. Improving the dielectric breakdown strength allows the use of larger electrically actuated strains for the polymer. By way of example, a plasticizing additive may be added to a polymer to increase the dielectric breakdown strength of the polymer. Alternatively, a synthetic resin may be added to a styrene-butadiene-styrene block copolymer to improve the dialectic breakdown strength of the copolymer. For example, pentalyn-H as produced by Hercules, Inc. of Wilmington, Del. was added to Kraton D2104 as produced by Shell Chemical of Houston, Tex. to improve the dialectic breakdown strength of the Kraton D2104. Further detail on the fabrication of polymers including addition of one or more additives is provided below. In this case, the ratio of pentalyn-H added may range from about 0 to 2:1 by weight. In another embodiment, an additive is included to increase the dielectric constant of a polymer. For example, high dielectric constant particulates such as fine ceramic powders may be added to increase the dielectric constant of a commercially available polymer. Alternatively, polymers such as polyurethane may be partially fluorinated to increase the dielectric constant.

Alternatively, an additive may be included in a polymer to reduce the elastic modulus of the polymer. Reducing the elastic modulus enables larger strains for the polymer. In a specific embodiment, mineral oil was added to a solution of Kraton D to reduce the elastic modulus of the polymer. In this case, the ratio of mineral oil added may range from about 0 to 2:1 by weight. Specific materials included to reduce the elastic modulus of an acrylic polymer of the present invention include any acrylic acids, acrylic adhesives, acrylics including flexible side groups such as isooctyl groups and 2-ethylhexyl groups, or any copolymer of acrylic acid and isooctyl acrylate.

Multiple additives may be included in a polymer to improve performance of one or more material properties. In one embodiment, mineral oil and pentalyn-H were both added to a solution of Kraton D2104 to increase the dielectric breakdown strength and to reduce the elastic modulus of the polymer. Alternatively, for a commercially available silicone rubber whose stiffness has been increased by fine carbon particles used to increase the dielectric constant, the stiffness may be reduced by the addition of a carbon or silver filled silicone grease.

An additive may also be included in a polymer to provide an additional property for the transducer. The additional property is not necessarily associated with polymer performance in converting between mechanical and electrical energy. By way of example, pentalyn-H may be added to Kraton D2104 to provide an adhesive property to the polymer. In this case, the additive also aids in conversion between mechanical and electrical energy. In a specific embodiment, polymers comprising Kraton D2104, pentalyn-H, mineral oil and fabricated using butyl acetate provided an adhesive polymer and a maximum linear strain in the range of about 70 to 200 percent.

Suitable actuation voltages for pre-strained polymers of the present invention may vary based on the electroactive polymer material and its properties (e.g. the dielectric constant) as well as the dimensions of the polymer (e.g. the thickness between electrodes). By way of example, actuation electric fields for the polymer 102 in FIG. 1A may range in magnitude from about 0 V/m to about 440 Mega Volts/meter. Actuation voltages in this range may produce a pressure in the range of about 0 Pa to about 10 MPa. To achieve a transducer capable of higher forces, the thickness of the polymer may be increased. Alternatively, multiple polymer layers may be implemented. Actuation voltages for a particular polymer may be reduced by increasing the dielectric constant, decreasing polymer thickness and decreasing the modulus of elasticity, for example.

Pre-strained polymers of the present invention may cover a wide range of thicknesses. In one embodiment, polymer thickness may range between about 1 micrometer and 2 millimeters. Typical thicknesses before pre-strain include 50-225 micrometers for HS3, 25-75 micrometers for NuSil CF 19-2186, 50-1000 micrometers for SBS, and 100-1000 microns for any of the 3M VHB 4900 series acrylic polymers. Polymer thickness may be reduced by stretching the film in one or both planar directions. In many cases, pre-strained polymers of the present invention may be fabricated and implemented as thin films. Thicknesses suitable for these thin films may be below 50 micrometers.

Transducers for converting between mechanical and electrical energy of the present invention also encompass multilayer laminates. In one embodiment, a multilayer laminate refers to a structure including one or more layers in addition to a single electroactive polymer and its corresponding electrodes. In one embodiment, a multilayer laminate refers to a structure having a transducer including an electroactive polymer and its corresponding electrodes, a layer laminated to at least one of the electrode and the polymer, and the layer mechanically coupled to a portion of the transducer. Multilayer laminates may be referred to as either external or internal. For external multilayer laminates, the one or more additional layers are not between the electrodes. For internal multilayer laminates, the one or more additional layers are between the electrodes. For either external or internal layers, the layers may be adhered using an adhesive or glue layer, for example.

Internal multilayer laminates may be used for a wide variety of purposes. A layer may also be included in an internal multilayer laminate to improve any mechanical or electrical property of the transducer, e.g., stiffness, electrical resistance, tear resistance, etc. Internal multilayer laminates may include a layer having a greater dielectric breakdown strength. Internal multilayer laminates may include multiple layers of compatible materials separated by conducting or semiconducting layers (e.g. metallic or polymer layers) to increase breakdown strength of the laminate transducer. Compatible materials refer to materials that comprise the same or substantially similar material or have the same or substantially similar properties (e.g. mechanical and/or electrical). Internal laminates of compatible materials relative to the polymer may be used to compensate for manufacturing defects in the polymer and provide greater transducer uniformity. By way of example, a 100 micrometer thick, single layer polymer may have a defect that may effect the entire 100 micrometer thickness. In this case, a laminate of ten layers each having a thickness of 10 micrometers may be used such that any manufacturing defects are localized to a 10 micrometer polymer—thus providing a comparable 100 micrometer thick laminate structure, but with greater uniformity and fault tolerance compared to the single layer polymer. Internal laminates of compatible materials relative to the polymer may also be used to prevent any runaway pull-in effect. Runaway pull-in effect refers to when the electrostatic forces between electrodes getting closer increases faster than the elastic resistive forces of the polymer. In such cases, the transducer may become electromechanically unstable, leading to rapid local thinning and electrical breakdown. An internal layer may also be used to afford a layer of protection (electrical or mechanical) to another layer in the composite. In one embodiment, an electrical barrier layer is mechanically coupled between an electrode and the polymer to minimize the effect of any localized breakdown in the polymer. Breakdown may be defined as the point at which the polymer cannot sustain the applied voltage. The barrier layer is typically thinner than the polymer and has a higher dielectric constant than the polymer such that the voltage drop mainly occurs across the polymer. It is often preferable that the barrier layer have a high dielectric breakdown strength.

External multilayer laminates may be used for a wide variety of purposes. In one embodiment, an external multilayer composite includes a layer to control stiffness, creep, to distribute load more uniformly during deflection, to increase tear resistance, or to prevent runaway pull effect. External laminates of compatible polymers including electrodes may be used to distribute load across each of the polymer layers or increase polymer uniformity during deflection. A layer may also be included in an external laminate having a higher stiffness than the polymer, e.g., a material having a higher stiffness or a different amount of pre-strain for a compatible material, to bias a diaphragm, pump or bending beam. In a generator mode, a stretched transducer may contract and generate electrical energy as long as the electrical field stresses are lower than the elastic restoring stresses. In this case, adding a stiffening layer may allow the transducer to contract against greater field stresses, thereby increasing its energy output per stroke. An external layer may also be used to afford a layer of protection (electrical or mechanical) to another layer in the composite. In another specific embodiment, an external composite includes a foam layer to bias a small pump or diaphragm. The foam layer may comprise an open pore foam that allows fluids to move in and out of the foam. An external layer having a low stiffness may also be used for electric shielding without introducing excessive mechanical energy loss.

In one embodiment, a composite is formed by rolling or folding a polymer to produce a transducer with high-density packaging. In order to avoid detrimental electric fields in the vicinity of folds for laminates including folded layers, electrodes may be patterned on the polymer such that any polymer in the vicinity of the folds does not have overlapping opposite electrodes. In addition, the polymer and electrodes may be rolled or folded such that the outer exposed electrode or electrodes have the same polarity. Fabrication may be performed such that electrodes of opposite polarity are separate by polymer. For example, a rolled actuator can be made by rolling up two layers of polymer with electrodes, or a single layer can be first folded, then rolled. Additionally, the outer exposed electrode may be grounded to increase safety of the transducer. An external laminate outer skin layer may also be added to further increase safety.

Actuator and Generator Devices

The deflection of a pre-strained polymer can be used in a variety of ways to produce or receive mechanical energy. Generally speaking, electroactive polymers of the present invention may be implemented with a variety of actuators and generators—including conventional actuators and generators retrofitted with a pre-strained polymer and custom actuators and generators specially designed for one or more pre-strained polymers. Conventional actuators and generators include extenders, bending beams, stacks, diaphragms, etc. Several different exemplary custom actuators and generators in accordance with the present invention will now be discussed.

Figure 1E:
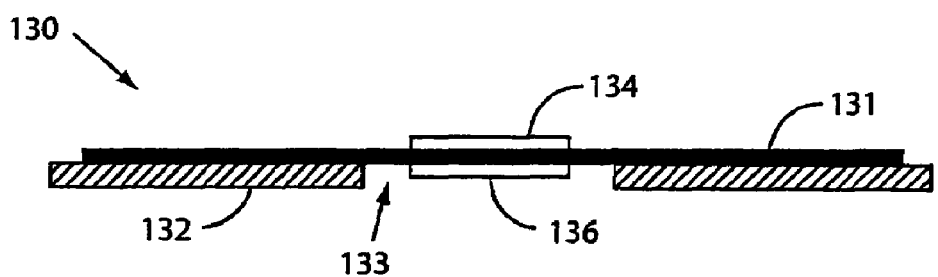
FIG. 1E illustrates a cross-sectional side view of a diaphragm transducer including an electroactive polymer before application of a voltage in accordance with one embodiment of the present invention.

FIG. 1E illustrates a cross-sectional side view of a diaphragm device 130 including a pre-strained polymer 131 before electrical actuation in accordance with one embodiment of the present invention. The pre-strained polymer 131 is attached to a frame 132. The frame 132 includes a non-circular aperture 133 that allows deflection of the polymer 131 perpendicular to the area of the non-circular aperture 133. The non-circular aperture 133 may be a rectangular slot, custom geometry aperture, etc. In some cases, a non-circular, elongated slot may be advantageous for a diaphragm device compared to a circular hole. For example, thickness strain is more uniform for an elongated slot compared to a hole. Non-uniform strains limit overall performance since the electrical breakdown of a polymer is typically determined by the thinnest point. The diaphragm device 130 includes electrodes 134 and 136 on either side of the polymer 131 to provide a voltage difference across a portion of the polymer 131.

Figure 1F:
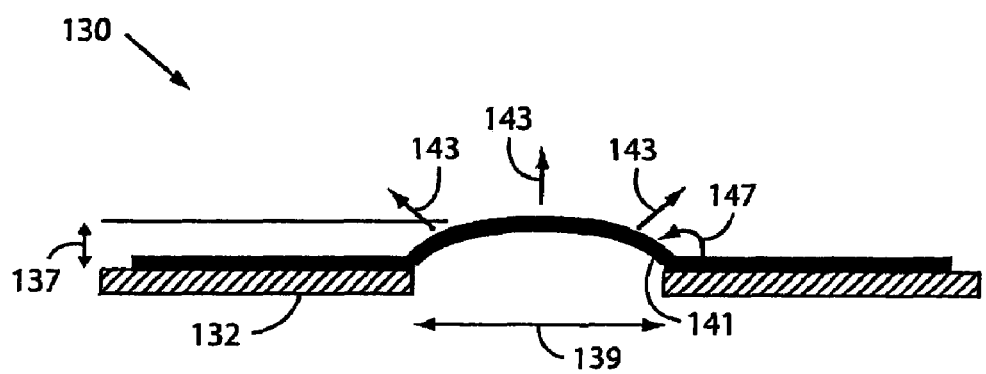
FIG. 1F illustrates a cross-sectional view of the electroactive polymer diaphragm of FIG. 1E after application of a voltage in accordance with one embodiment of the present invention.

In the voltage-off configuration of FIG. 1E, the polymer 131 is stretched and secured to the frame 132 with tension to achieve pre-strain. Upon application of a suitable voltage to the electrodes 134 and 136, the polymer film 131 expands away from the plane of the frame 132 as illustrated in FIG. 1F. The electrodes 134 and 136 are compliant and change shape with the pre-strained polymer 131 as it deflects.

The diaphragm device 130 is capable of expansion in both directions away from the plane. In one embodiment, the bottom side 141 of the polymer 131 includes a bias pressure that influences the expansion of the polymer film 131 to continually actuate upward in the direction of arrows 143 (FIG. 1F). In another embodiment, a swelling agent such as a small amount of silicone oil is applied to the bottom side 141 to influence the expansion of the polymer 131 in the direction of arrows 143. The swelling agent causes slight permanent deflection in one direction as determined during fabrication, e.g. by supplying a slight pressure on the bottom side 141 when the swelling agent is applied. The swelling agent allows the diaphragm to continually actuate in a desired direction without using a bias pressure.

The amount of expansion for the diaphragm device 130 will vary based on a number of factors including the polymer 131 material, the applied voltage, the amount of pre-strain, any bias pressure, compliance of the electrodes 134 and 136, etc. In one embodiment, the polymer 131 is capable of deflections to a height 137 at least about 50 percent of the hole diameter 139 and may take a hemispheric shape at large deflections. In this case, an angle 147 formed between the polymer 131 and the frame 132 may be less than 90 degrees.

The diaphragm device 130 may also be used as a generator. In this case, a pressure, such as a fluid pressure, acts as mechanical input to the diaphragm on the bottom 141 to stretch the transducer (polymer 134 and electrodes 134 and 136) in the vicinity of the aperture 133 as shown in FIG. 1F. A voltage difference is applied between electrodes 134 and 136 while the transducer is stretched, and releasing the pressure allows the diaphragm to contract and increase the stored electrical energy on the transducer.

Expansion in one direction of an electroactive polymer may induce contractile stresses in a second direction such as due to Poisson effects. This may reduce the mechanical output for a transducer that provides mechanical output in the second direction. Correspondingly, actuators of the present invention may be designed to constrain a polymer in the non-output direction. In some cases, actuators may be designed to improve mechanical output using deflection in the non-output direction.

Figure 2H:
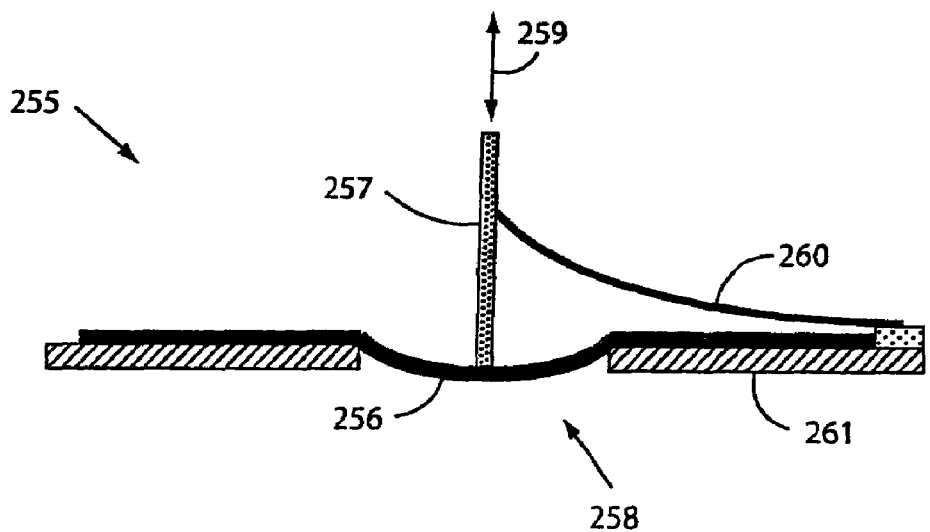
FIG. 2H illustrates a device for converting between electrical energy and mechanical energy comprising an electroactive polymer diaphragm in accordance with another embodiment of the present invention.
Figure 2A:
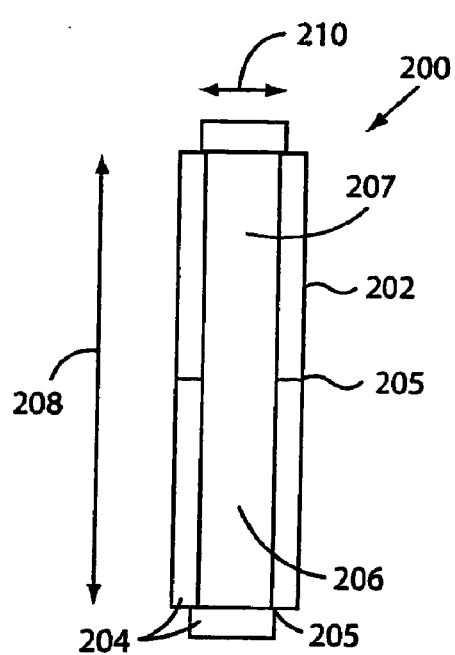
FIGS. 2A and 2B illustrate a device for converting between electrical energy and mechanical energy before and after actuation in accordance with a specific embodiment of the present invention.
Figure 2B:
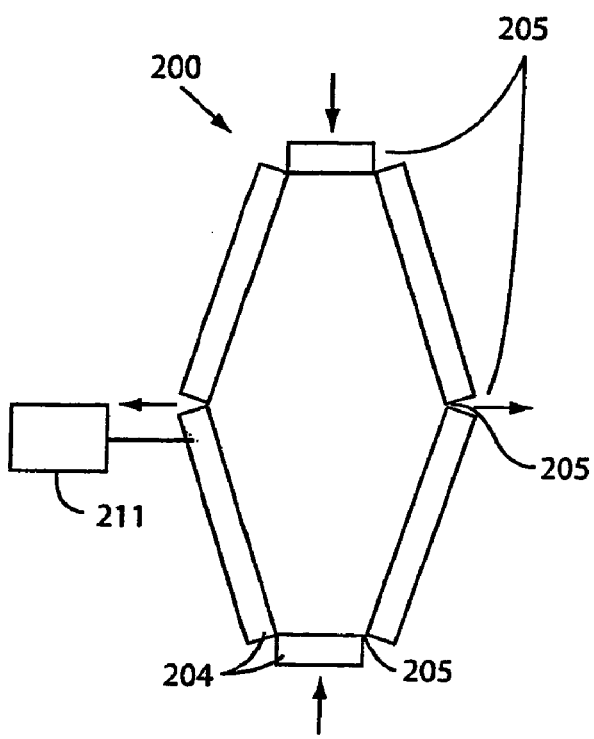

One device which uses deflection in one planar direction to improve energy conversion in the other planar direction is a bow device. FIGS. 2A and 2B illustrate a bow device 200 for converting between electrical energy and mechanical energy before and after electrical actuation in accordance with a specific embodiment of the present invention. The bow device 200 is a planar mechanism comprising a flexible frame 202 which provides mechanical assistance to improve conversion between electrical energy and mechanical energy for a polymer 206 attached to the frame 202. The frame 202 includes six rigid members 204 connected at joints 205. The members 204 and joints 205 provide mechanical assistance by coupling polymer deflection in a planar direction 208 into mechanical output in a perpendicular planar direction 210. More specifically, the frame 202 is arranged such that a small deflection of the polymer 206 in the direction 208 improves displacement in the perpendicular planar direction 210. Attached to opposite (top and bottom) surfaces of the polymer 206 are electrodes 207 (bottom electrode on bottom side of polymer 206 not shown) to provide a voltage difference across a portion of the polymer 206.

The polymer 206 is configured with different levels of pre-strain in its orthogonal directions. More specifically, the electroactive polymer 206 includes a high pre-strain in the planar direction 208, and little or no pre-strain in the perpendicular planar direction 210. This anisotropic pre-strain is arranged relative to the geometry of the frame 202. More specifically, upon actuation across electrodes 207, the polymer contracts in the high pre-strained direction 208. With the restricted motion of the frame 202 and the lever arm provided by the members 204, this contraction helps drive deflection in the perpendicular planar direction 210. Thus, even for a short deflection of the polymer 206 in the high pre-strain direction 208, the frame 202 bows outward in the direction 210. In this manner, a small contraction in the high pre-strain direction 210 becomes a larger expansion in the relatively low pre-strain direction 208.

Using the anisotropic pre-strain and constraint provided by the frame 202, the bow device 200 allows contraction in one direction to enhance mechanical deflection and electrical to mechanical conversion in another. In other words, a load 211 (FIG. 2B) attached to the bow device 200 is coupled to deflection of the polymer 206 in two directions—direction 208 and 210. Thus, as a result of the differential pre-strain of the polymer 206 and the geometry of the frame 202, the bow device 200 is able to provide a larger mechanical displacement and mechanical energy output than an electroactive polymer alone for common electrical input.

The bow device 200 may be configured based on the polymer 206. By way of example, the geometry of the frame 202 and dimensions of the polymer 206 may be adapted based on the polymer 206 material. In a specific embodiment using HS3 silicone as the polymer 206, the polymer 206 preferably has a ratio in directions 208 and 210 of 9:2 with pre-strains about 270 percent and −25 percent in the directions 208 and 210 respectively. Using this arrangement, linear strains of at least about 100 percent in direction 210 are possible.

The pre-strain in the polymer 206 and constraint provided by the frame 202 may also allow the bow device 200 to utilize lower actuation voltages for the pre-strained polymer 206 for a given deflection. As the bow device 200 has a lower effective modulus of elasticity in the low pre-strained direction 210, the mechanical constraint provided by the frame 202 allows the bow device 200 to be actuated in the direction 210 to a larger deflection with a lower voltage. In addition, the high pre-strain in the direction 208 increases the breakdown strength of the polymer 206, permitting higher voltages and higher deflections for the bow device 200.

As mentioned earlier with respect FIG. 1A, when a polymer expands as a result of electrostatic forces, it continues to expand until mechanical forces balance the electrostatic pressure driving the expansion. When the load 211 is attached to the bow device 200, mechanical effects provided by the load 211 will influence the force balance and deflection of the polymer 206. For example, if the load 211 resists expansion of the bow device 200, then the polymer 206 may not expand as much as if were there no load.

Figure 2C:
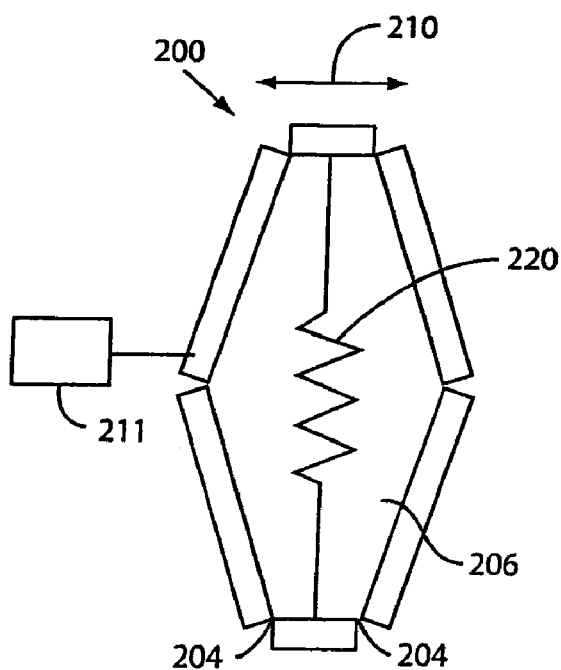
FIG. 2C illustrates a device for converting between electrical energy and mechanical energy including additional components to improve deflection in accordance with a specific embodiment of the present invention.

In one embodiment, the bow device 200 may include additional components to provide mechanical assistance and enhance mechanical output. By way of example, springs 220 as shown in FIG. 2C may be attached to the bow device 200 to enhance deflection in the direction 210. The springs load the bow device 200 such that the spring force exerted by the springs opposes resistance provided by an external load. In some cases, the springs 220 provide increasing assistance for bow device 200 deflection. In one embodiment, spring elements may be built into the joints 205 instead of the external springs 220 to enhance deflection of the bow device 200. In addition, pre-strain may be increased to enhance deflection. The load may also be coupled to the rigid members 204 on top and bottom of the frame 202 rather than on the rigid members of the side of the frame 202 (as shown in FIG. 2B). Since the top and bottom rigid members 204 contract towards each other when voltage is applied as shown in FIG. 2B, the bow actuator 200 provides an exemplary device contracts in the plane upon application of a voltage rather than expands.

When used as a generator, the bow device 200 improves conversion of mechanical to electrical energy. Recall that a generator (as in FIGS. 1A and 1B) of the present invention will convert mechanical energy to electrical energy when it contracts. Also recall that if the electric field pressure increases and reaches balance with the elastic restoring stresses during contraction, the contraction will stop and may diminish efficiency. The elastic energy per unit volume in a polymer is typically proportional to the elastic restoring stress or pressure, e.g. the stress applied at a boundary. One way to maximize the elastic energy for a given restoring stress or pressure is to use a lower modulus polymer. Lower modulus polymers may, however, generally have lower breakdown strengths, and may negate the advantages of a low modulus. The bow device 200 is one way to maximize the elastic energy for a given net restoring stress or pressure without using a lower modulus material. This is done using the frame 202 in conjunction with anisotropic pre-strains in directions 208 and 210 so that the net restoring pressure or force for a given strain is less than it would be for free boundary conditions on the polymer 206. A high prestrain in direction 208 supplies elastic energy via the frame 202 to assist in the expansion in the direction 210. With regards to expansion in direction 210, the polymer acts as though it has a low modulus, and a large amount of elastic energy can be stored for a given input force or input stress at the boundary. Since the contraction in direction 208 is small and the area change from the small contraction is correspondingly small, the electrical behavior due to changes in direction 208 are minimal compared to the large electrical behavior (e.g. change in capacitance) due to the large strain changes in direction 210. The polymer 206 therefore behaves as if it were a very low modulus material that stretches substantially in one direction (direction 210), allowing the bow device 200 to convert a relatively large amount of energy per unit volume of polymer per stroke at high efficiencies compared to other devices using the same polymer 206.

The shape and constraint of the polymer may affect deflection. An aspect ratio for an electroactive polymer is defined as the ratio of its length to width. If the aspect ratio is high (e.g., an aspect ratio of at least about 4:1) and the polymer is constrained along its length by rigid members, than the combination may result in a substantially one dimensional deflection in the width direction.

Figure 2D:
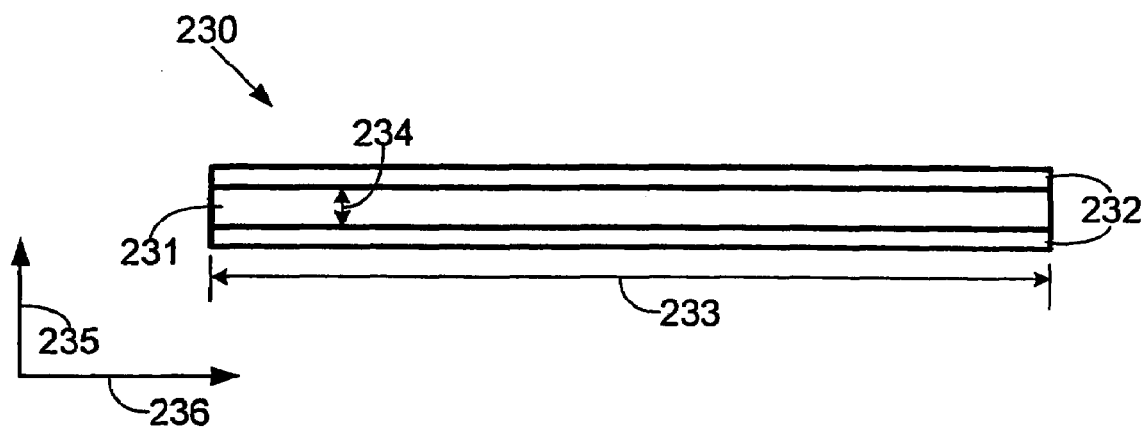
FIGS. 2D and 2E illustrate a device for converting between electrical energy and mechanical energy before and after actuation in accordance with a specific embodiment of the present invention.
Figure 2E:
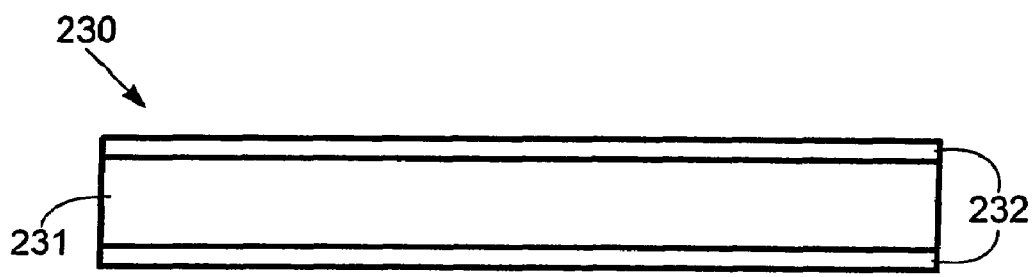

FIGS. 2D and 2E illustrate a linear motion device 230 for converting between electrical energy and mechanical energy before and after actuation in accordance with a specific embodiment of the present invention. The linear motion device 230 is a planar mechanism having mechanical translation in one direction. The linear motion device 230 comprises a polymer 231 having a length 233 substantially greater than its width 234 (e.g., an aspect ratio at least about 4:1). The polymer 231 is attached on opposite sides to stiff members 232 of a frame along its length 233. The stiff members 232 have a greater stiffness than the polymer 231. The geometric edge constraint provided by the stiff members 232 substantially prevents displacement in a direction 236 along the polymer length 233 and facilitates deflection almost exclusively in a direction 235. When the linear motion device 230 is implemented with a polymer 231 having anisotropic pre-strain, such as a higher pre-strain in the direction 236 than in the direction 235, then the polymer 231 is stiffer in the direction 236 than in the direction 235 and large deflections in the direction 235 may result. By way of example, such an arrangement may produce linear strains of at least about 200 percent for acrylics having an anisotropic pre-strain.

A collection of electroactive polymers or actuators may be mechanically linked to form a larger actuator with a common output, e.g. force and/or displacement. By using a small electroactive polymer as a base unit in a collection, conversion of electric energy to mechanical energy may be scaled according to an application. By way of example, multiple linear motion devices 230 may be combined in series in the direction 235 to form an actuator having a cumulative deflection of all the linear motion devices in the series. When transducing electric energy into mechanical energy, electroactive polymers—either individually or mechanically linked in a collection—may be referred to as 'artificial muscle'. For purposes herein, artificial muscle is defined as one or more transducers and/or actuators having a single output force and/or displacement. Artificial muscle may be implemented on a micro or macro level and may comprise any one or more of the actuators described herein.

Figure 2F:
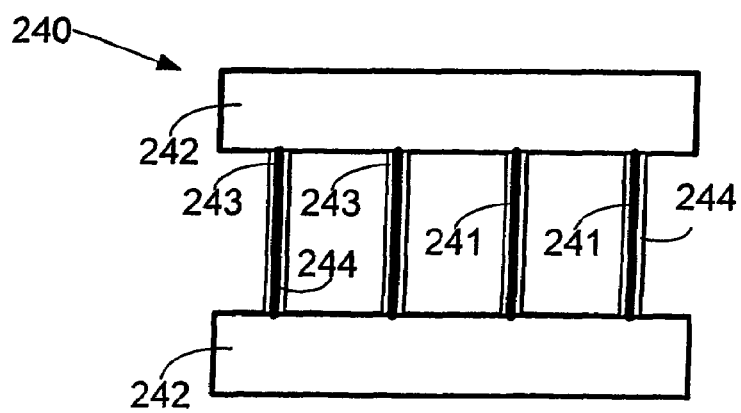
FIG. 2F illustrates a cross-sectional side view of a transducer including multiple polymer layers in accordance with one embodiment of the present invention.

FIG. 2F illustrates cross-sectional side view of a multilayer device 240 for converting between electrical energy and mechanical energy as an example of artificial muscle in accordance with a specific embodiment of the present invention. The multilayer device 240 includes four pre-strained polymers 241 arranged in parallel and each attached to a rigid frame 242 such that they have the same deflection. Electrodes 243 and 244 are deposited on opposite surfaces of each polymer 241 and provide simultaneous electrostatic actuation to the four pre-strained polymers 241. The multilayer device 240 provides cumulative force output of the individual polymer layers 241.

Combining individual polymer layers in parallel or in series has a similar effect on transducers operated in a generator mode. In general, coupling layers in parallel increases the stiffness and maximum input force of the device without changing its maximum stroke, while combining layers in series increases the maximum stroke without increasing the maximum input force. Thus, by combining layers in series and parallel, a generator can be designed to match a specific input mechanical load.

Figure 2G:
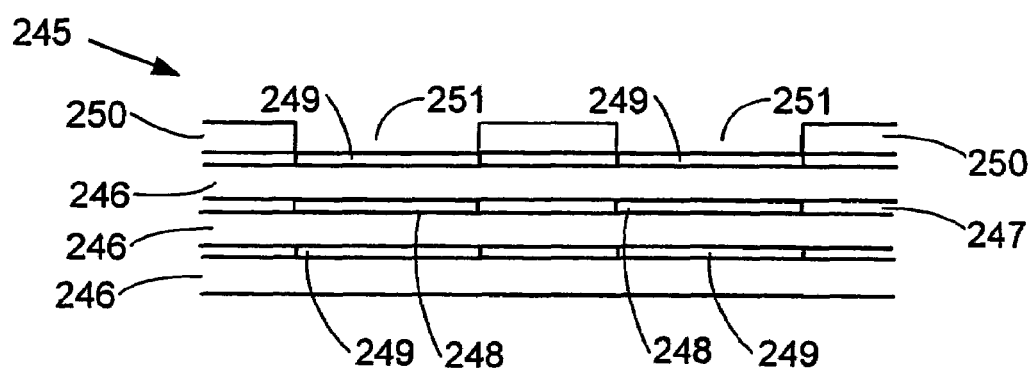
FIG. 2G illustrates a stacked multilayer device as an example of artificial muscle in accordance with one embodiment of the present invention.
Figure 21:
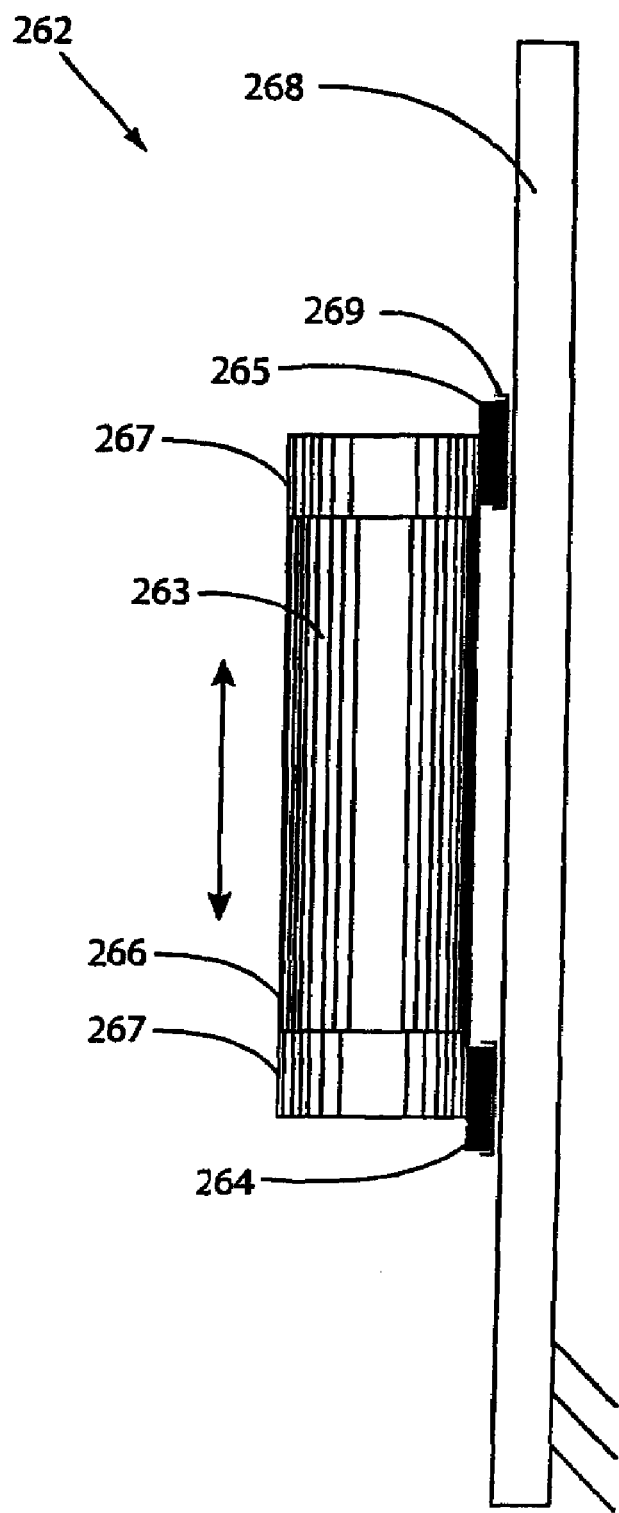

In another embodiment, multiple electroactive polymer layers may be used in place of one polymer to increase the force or pressure output of an actuator. For example, ten electroactive polymers may be layered to increase the pressure output of the diaphragm device of FIG. 1E. FIG. 2G illustrates such a stacked multilayer diaphragm device 245 for converting between electrical energy and mechanical energy as another example of artificial muscle in accordance with one embodiment of the present invention. The stacked multilayer device 245 includes three polymer layers 246 layered upon each other and may be attached by adhesive layers 247. Within the adhesive layers 247 are electrodes 248 and 249 that provide actuation to polymer layers 246. A relatively rigid plate 250 is attached to the outermost polymer layer and patterned to include holes 251 that allow deflection for the stacked multilayer diaphragm device 245. By combining the polymer layers 246, the stacked multilayer device 245 provides cumulative force output of the individual polymer layers 246.

In addition to the linear motion device 230 of FIGS. 2D and 2E, electroactive polymers of the present invention may be included in a variety of devices that convert between electrical energy and mechanical energy. FIG. 2H illustrates a linear actuator 255 comprising an electroactive polymer diaphragm 256 for converting between electrical energy and mechanical energy in accordance with another embodiment of the present invention. In this case, an output shaft 257 is attached to a central portion of the diaphragm 256 that deflects in a non-circular aperture 258 of a frame 261. Upon actuation and removal of electrostatic energy, the output shaft 257 translates as indicated by arrow 259. The linear actuator 255 may also include a compliant spring element 260 that helps position the output shaft 257.

In one embodiment, the non-circular aperture 258 is an elongated slot. As noted previously, an elongated slot typically has more uniform strain than a circular hole. In addition, the polymer diaphragm 256 has a higher pre-strain in the long axis of the slot relative to the pre-strain in the perpendicular planar direction. By using relatively high pre-strain in the long slot direction, and relatively low pre-strain in the perpendicular planar direction, the displacement of the output shaft 257 can be increased relative to uniform pre-strain configurations.

In another embodiment, pre-strained polymers of the present invention may be rolled or folded into linear transducers and actuators that deflect axially while converting between electrical energy and mechanical energy. As fabrication of electroactive polymers is often simplest with fewer numbers of layers, rolled actuators provide an efficient manner of squeezing large layers of polymer into a compact shape. Rolled or folded transducers and actuators typically include two or more layers of polymer. Rolled or folded actuators are applicable wherever linear actuators are used, such as robotic legs and fingers, high force grippers, and general-purpose linear actuators.

FIG. 2I illustrates an inchworm-type actuator 262 in accordance with a specific embodiment of the present invention. The inchworm-type actuator 262 includes two or more rolled pre-strained polymer layers with electrodes 263 that deflect axially along its cylindrical axis. The inchworm-type actuator 262 also includes electrostatic clamps 264 and 265 for attaching and detaching to a metal surface 268. The electrostatic clamps 264 and 265 allow the total stroke for the inchworm-type actuator 262 to be increased compared to an actuator without clamping. As the clamping force per unit weight for the electrostatic clamps 264 and 265 is high, the force per unit weight advantages of pre-strained polymers of the present invention are preserved with the inchworm-type actuator 262. The electrostatic clamps 264 and 265 are attached to the inchworm-type actuator at connection regions 267. A body 266 of the inchworm-type actuator includes the connection regions 267 and the polymer 263 and has a degree of freedom along the axial direction of the rolled polymer 263 between the connection regions 267. In one embodiment, the electrostatic clamps 264 and 265 include an insulating adhesive 269 that prevents electrical shorting from the conductive electrostatic clamps 264 and 265 to the metal surface 268.

The inchworm-type actuator 262 moves upward in a six step process. In step one, the inchworm-type actuator 262 is immobilized at its respective ends when both electrostatic clamps 264 and 265 are actuated and the polymer 263 is relaxed. An electrostatic clamp is actuated by applying a voltage difference between the clamp and the metal surface 268. In step two, clamp 265 is released. Releasing one of the clamps 264 and 265 allows its respective end of the inchworm-type actuator 262 to move freely. In step three, the electroactive polymer 263 is actuated and extends the inchworm-type actuator 262 upward. In step four, clamp 265 is actuated and the inchworm-type actuator 262 is immobilized. In step five, clamp 264 is released. In step six, the polymer 263 is relaxed and the inchworm-type actuator 262 contracts. By cyclically repeating steps one through six, the inchworm-type actuator 262 moves in the upward direction. By switching clamps 264 and 265 in the above six step process, the inchworm-type actuator 262 moves in a reverse direction.

Although the inchworm-type actuator 262 has been described in terms of actuation using a single electroactive polymer and two clamps, multiple segment inchworm-type actuators using multiple electroactive polymers may be implemented. Multiple segment inchworm-type actuators allow an inchworm-type actuator to increase in length without becoming thicker. A two-segment inchworm-type actuator would use two rolled polymers rather than one and three clamps rather than two. In general, an n-segment inchworm-type actuator comprises n actuators between n+1 clamps.

Figure 2J:
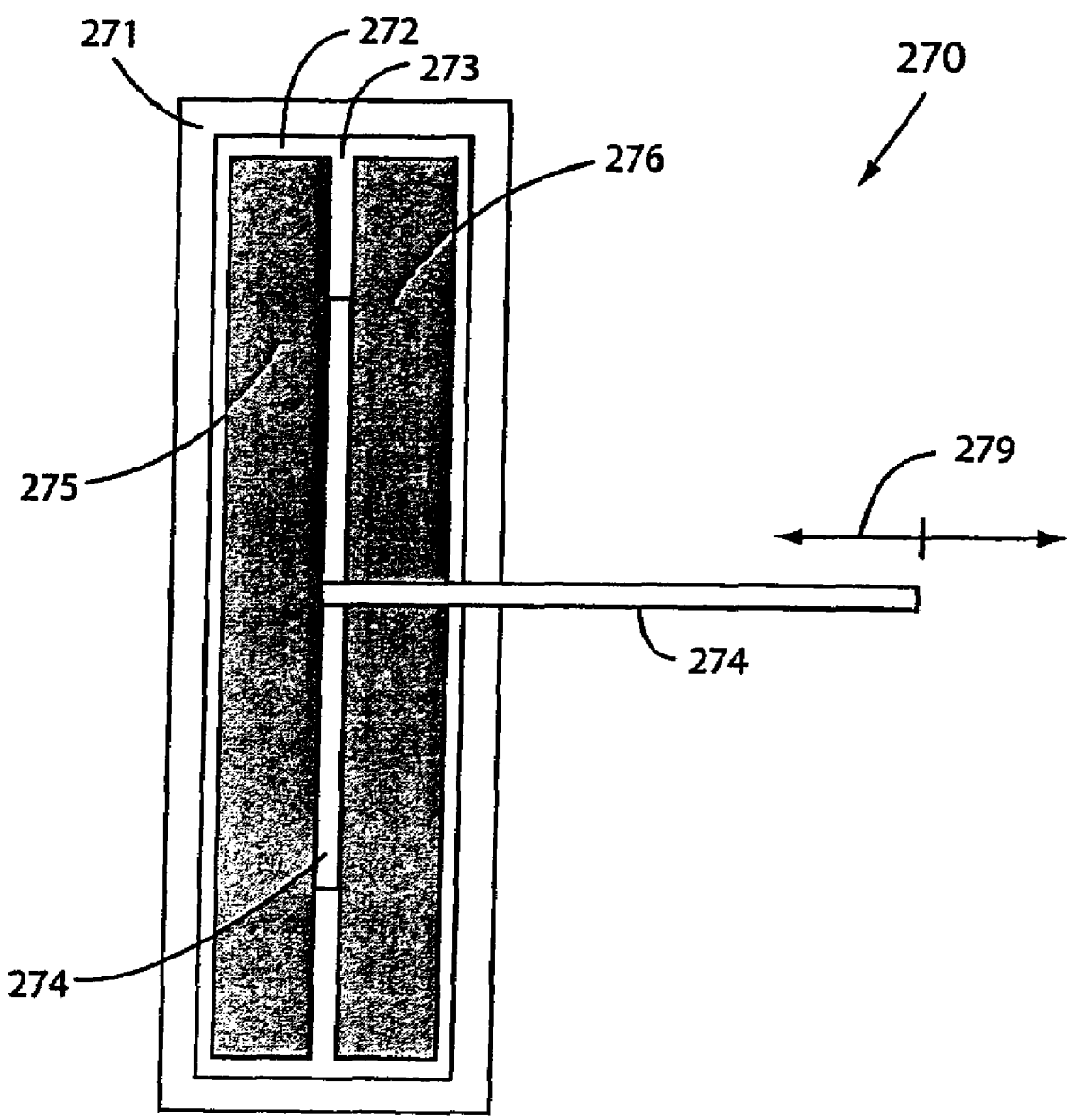
FIG. 2J illustrates a device for converting between electrical energy and mechanical energy in one direction in accordance with another embodiment of the present invention.

FIG. 2J illustrates a stretched film device 270 for converting between electrical energy and mechanical energy in accordance with another embodiment of the present invention. The stretched film device 270 includes a rigid frame 271 having a hole 272. A pre-strained polymer 273 is attached in tension to the frame 271 and spans the hole 272. A rigid bar 274 is attached to the center of the polymer 273 and provides external displacement corresponding to deflection of the polymer 273. Compliant electrode pairs 275 and 276 are patterned on both top and bottom surfaces of the polymer 273 on the left and right sides respectively of the rigid bar 274. When the electrode pair 275 is actuated, a portion of the polymer 273 between and in the vicinity of the top and bottom electrode pair 275 expands relative to the rest of the polymer 273 and the existing tension in the remainder of the polymer 273 pulls the rigid bar 274 to move to the right. Conversely, when the electrode pair 276 is actuated, a second portion of the polymer 273 affected by the electrode pair 276 expands relative to the rest of the polymer 273 and allows the rigid bar 274 to move to the left. Alternating actuation of the electrodes 275 and 276 provides an effectively larger total stroke 279 for the rigid bar 274. One variation of this actuator includes adding anisotropic pre-strain to the polymer such that the polymer has high pre-strain (and stiffness) in the direction perpendicular to the rigid bar displacement. Another variation is to eliminate one of the electrode pairs. For the benefit of simplifying the design, this variation reduces the stroke 279 for the stretched film device 270. In this case, the portion of the polymer no longer used by the removed electrode now responds passively like a restoring spring.

Figure 2K:
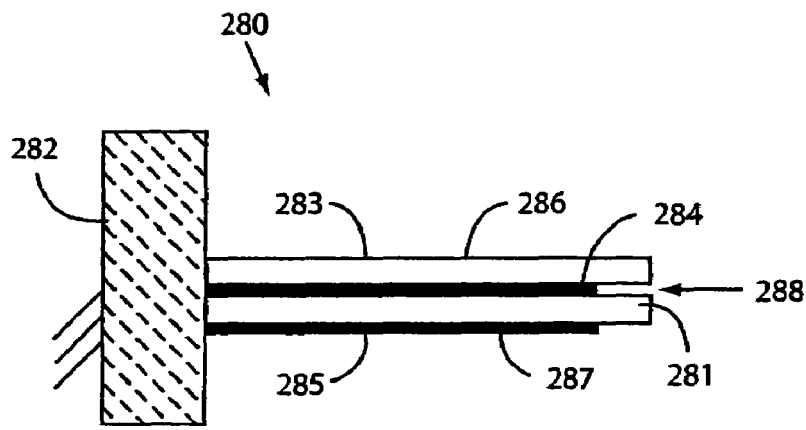
FIG. 2K illustrates a device for converting between electrical energy and mechanical energy in accordance with another embodiment of the present invention.
Figure 2L:
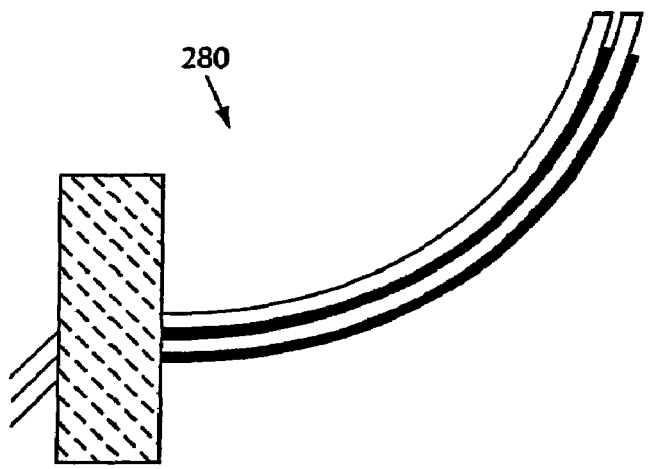
FIG. 2L illustrates the device of FIG. 2K with a 90 degree bending angle.

FIG. 2K illustrates a bending beam device 280 for converting between mechanical and electrical energy in accordance with another embodiment of the present invention. The bending beam device 280 includes a polymer 281 fixed at one end by a rigid support 282 and attached to a flexible thin material 283 such as polyimide or mylar using an adhesive layer, for example. The flexible thin material 283 has a modulus of elasticity greater than the polymer 281. The difference in modulus of elasticity for the top and bottom sides 286 and 287 of the bending beam device 280 causes the bending beam device 280 to bend upon actuation. Electrodes 284 and 285 are attached to the opposite sides of the polymer 281 to provide electrical energy. The bending beam device 280 includes a free end 288 having a single bending degree of freedom. Deflection of the free end 288 may be measured by the difference in angle between the free end 288 and the end fixed by the rigid support 282. FIG. 2L illustrates the bending beam device 280 with a 90 degree bending angle.

The maximum bending angle for the bending beam device 280 will vary with a number of factors including the polymer material, the actuator length, the bending stiffness of the electrodes 284 and 285 and flexible thin material 283, etc. For a bending beam device 280 comprising Dow Corning HS3 silicone, gold electrodes and an active area of 3.5 mm in length, bending angles over 225 degrees are attainable. For the bending beam device 280, as the length of the active area increases, increased bending angles are attainable. Correspondingly, by extending the active length of the above mentioned bending beam device to 5 mm allows for a bending angle approaching 360 degrees.

In one embodiment, one of the electrodes may act as the flexible thin material 283. Any thin metal, such as gold, having a low bending stiffness and a high tensile stiffness may be suitable for an electrode acting as the flexible thin material 283. In another embodiment, a barrier layer is attached between one of the electrodes 284 and 285 and the polymer 281 to minimize the effect of any localized breakdown in the polymer.

Figure 2M:
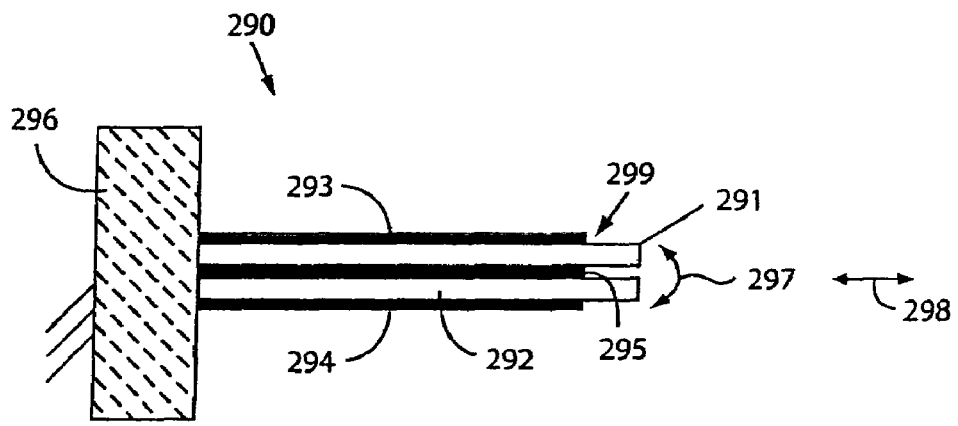
FIG. 2M illustrates a device for converting between electrical and mechanical energy including two polymer layers in accordance with another embodiment of the present invention.

FIG. 2M illustrates a bending beam device 290 for converting between mechanical and electrical energy in accordance with another embodiment of the present invention. The bending beam device 290 includes top and bottom pre-strained polymers 291 and 292 fixed at one end by a rigid support 296. Each of the polymers 291 and 292 may be independently actuated. Independent actuation is achieved by separate electrical control of top and bottom electrodes 293 and 294 attached to the top and bottom electroactive polymers 291 and 292, respectively. A common electrode 295 is situated between the top and bottom electroactive polymers 291 and 292 and attached to both. The common electrode 295 may be of sufficient stiffness to maintain the pre-strain on the polymer layers 291 and 292 while still permitting extension and bending.

Actuating the top electroactive polymer 291 using the top pair of electrodes 293 and 295 causes the bending beam device 290 to bend downward. Actuating the bottom polymer 292 using the bottom pair of electrodes 294 and 295 causes the bending beam device 290 to bend upward. Thus, independent use of the top and bottom electroactive polymers 291 and 292 allows the bending beam device 290 to be controlled along a radial direction 297. When both top and bottom polymers 291 and 292 are actuated simultaneously—and are of substantially similar size and material—the bending beam device 290 extends in length along the linear direction 298. Combining the ability to control motion in the radial direction 297 and the linear direction 298, the bending beam device 290 becomes a two-degree-of-freedom actuator. Correspondingly, independent actuation and control of the top and bottom polymers 291 and 292 allows a free end 299 of the bending beam device 290 to execute complex motions such as circular or elliptical paths.

Figure 2N:
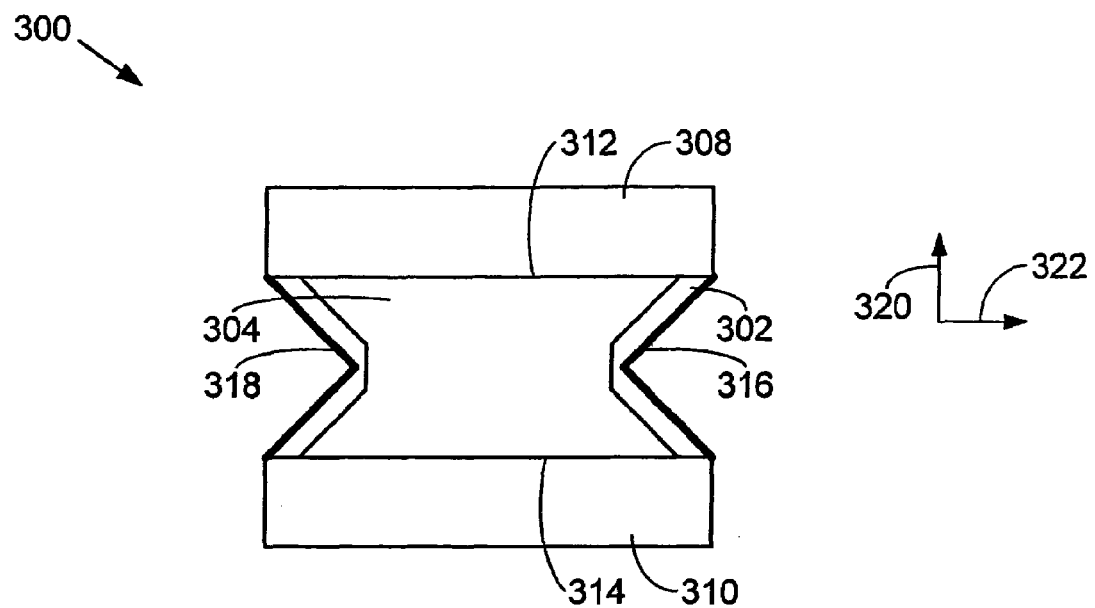
FIGS. 2N and 2O illustrate a device for converting between electrical energy and mechanical energy in accordance with another embodiment of the present invention.
Figure 2O:
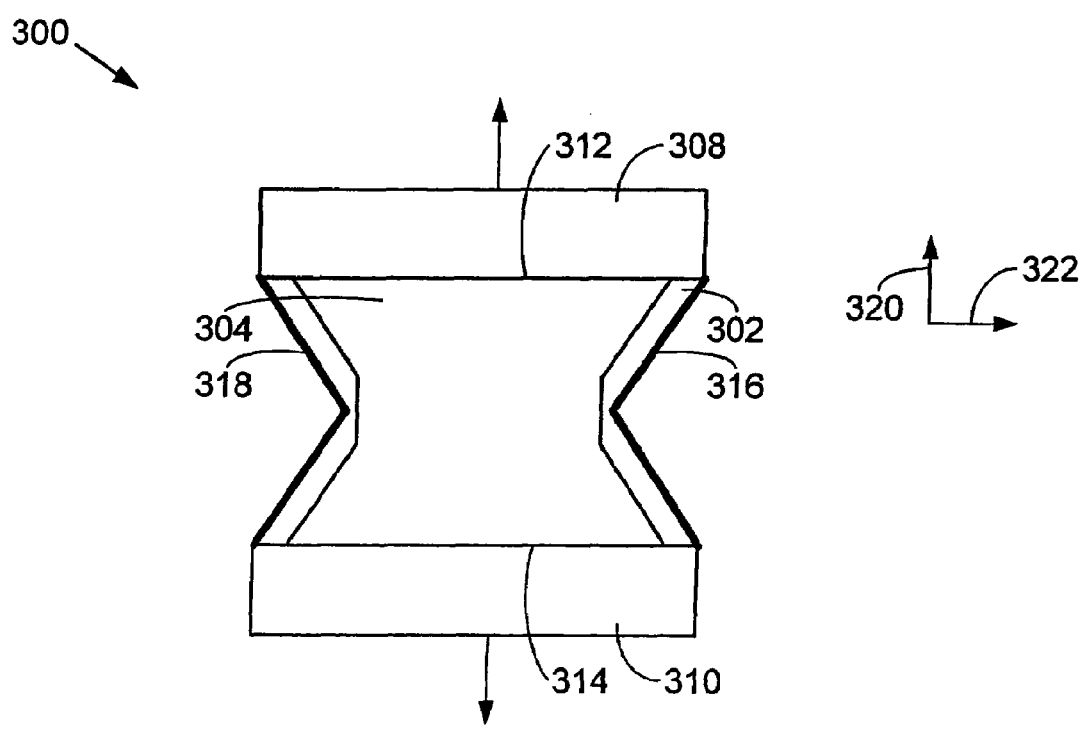

FIGS. 2N and 2O illustrate a device 300 for converting between electrical energy and mechanical energy in accordance with another embodiment of the present invention. The device 300 includes a polymer 302 arranged in a manner which causes a portion of the polymer to deflect in response to a change in electric field and/or arranged in a manner which causes a change in electric field in response to deflection of the polymer. Electrodes 304 are attached to opposite surfaces (only the foremost electrode is shown) of the polymer 302 and cover a substantial portion of the polymer 302. Two stiff members 308 and 310 extend along opposite edges 312 and 314 of the polymer 302. Flexures 316 and 318 are situated along the remaining edges of the polymer 302. The flexures 316 and 318 improve conversion between electrical energy and mechanical energy for the device 300.

The flexures 316 and 318 couple polymer 302 deflection in one direction into deflection in another direction. In one embodiment, each of the flexures 316 and 318 rest at an angle about 45 degrees in the plane of the polymer 302. Upon actuation of the polymer 302, expansion of the polymer 302 in the direction 320 causes the stiff members 308 and 310 to move apart, as shown in FIG. 2O. In addition, expansion of the polymer 302 in the direction 322 causes the flexures 316 and 318 to straighten, and further separates the stiff members 308 and 310. In this manner, the device 300 couples expansion of the polymer 302 in both planar directions 320 and 322 into mechanical output in the direction 320.

In one embodiment, the polymer 302 is configured with different levels of pre-strain in orthogonal directions 320 and 322. More specifically, the polymer 302 includes a higher pre-strain in the direction 320, and little or no pre-strain in the perpendicular planar direction 322. This anisotropic pre-strain is arranged relative to the geometry of the flexures 316 and 318.

One advantage of the device 300 is that the entire structure is planar. In addition to simplifying fabrication, the planar structure of the device 300 allows for easy mechanical coupling to produce multilayer designs. By way of example, the stiff members 308 and 310 may be mechanically coupled (e.g. glued or similarly fixed) to their respective counterparts of a second device 300 to provide two devices 300 in parallel in order to increase the force output over single device 300. Similarly, the stiff member 308 from one device may be attached to the stiff member 310 from a second device in order to provide multiple devices in series that increase the deflection output over a single device 300.

In addition to good performance of the device 300 as in actuator which converts electrical energy into mechanical energy, the device 300 is also well-suited as a generator. For example, when a charge is placed on the polymer 302 while it is stretched, contraction of the device 300 converts mechanical energy to electrical energy. The electrical energy may then be harvested by a circuit in electrical communication with the electrodes 304.

Performance

A transducer in accordance with the present invention converts between electrical energy and mechanical energy. Transducer performance may be characterized in terms of the transducer by itself, the performance of the transducer in an actuator, or the performance of the transducer in a specific application (e.g., a number of transducers implemented in a motor). Pre-straining electroactive polymers in accordance with the present invention provides substantial improvements in transducer performance.

Characterizing the performance of a transducer by itself usually relates to the material properties of the polymer and electrodes. Performance of an electroactive polymer may be described independent of polymer size by parameters such as strain, energy density, actuation pressure, actuation pressure density and efficiency. It should be noted that the performance characterization of pre-strained polymers and their respective transducers described below may vary for different electroactive polymers and electrodes.

Pre-strained polymers of the present invention may have an effective modulus in the range of about 0.1 to about 100 MPa. Actuation pressure is defined as the change in force within a pre-strained polymer per unit cross-sectional area between actuated and unactuated states. In some cases, pre-strained polymers of the present invention may have an actuation pressure in the range of about 0 to about 100 MPa, and more preferably in the range of about 0.1 to 10 MPa. Specific elastic energy density—defined as the energy of deformation of a unit mass of the material in the transition between actuated and unactuated states—may also be used to describe an electroactive polymer where weight is important. Pre-strained polymers of the present invention may have a specific elastic energy density above 3 J/g.

The performance of a pre-strained polymer may also be described, independent of polymer size, by efficiency. Electromechanical efficiency is defined as the ratio of mechanical output energy to electrical input energy for an actuator mode of operation or, alternatively, of the ratio of electrical output energy to mechanical input energy for a generator mode of operation. Electromechanical efficiency greater than 80 percent is achievable with some pre-strained polymers of the present invention. The time for a pre-strained polymer to rise (or fall) to its maximum (or minimum) actuation pressure is referred to as its response time. Pre-strained polymer polymers in accordance with the present invention may accommodate a wide range of response times. Depending on the size and configuration of the polymer, response times may range from about 0.01 milliseconds to 1 second, for example. A pre-strained polymer excited at a high rate may also be characterized by an operational frequency. In one embodiment, maximum operational frequencies suitable for use with the present invention may be in the range of about 100 Hz to 100 kHz. Operational frequencies in this range allow pre-strained polymers of the present invention to be used in various acoustic applications (e.g., speakers). In some embodiments, pre-strained polymers of the present invention may be operated at a resonant frequency to improve mechanical output.

Performance of an actuator may be described by a performance parameter specific to the actuator. By way of example, performance of an actuator of a certain size and weight may be quantified by parameters such as stroke or displacement, force, actuator response time. Characterizing the performance of a transducer in an application relates to how well the transducer is embodied in a particular application (e.g. in robotics). Performance of a transducer in an application may be described by a performance parameter specific to the application (e.g., force/unit weight in robotic applications). Application specific parameters include stroke or displacement, force, actuator response time, frequency response, efficiency, etc. These parameters may depend on the size, mass and/or the design of the transducer and the particular application.

It should be noted that desirable material properties for an electroactive polymer may vary with an actuator or application. To produce a large actuation pressures and large strain for an application, a pre-strained polymer may be implemented with one of a high dielectric strength, a high dielectric constant, and a low modulus of elasticity. Additionally, a polymer may include one of a high-volume resistivity and low mechanical damping for maximizing energy efficiency for an application.

Performance parameters for a transducer in a generator mode of operation are generally analogous to those of the actuator mode. Specific energy density of a generator transducer is defined as the electrical energy generated per stroke per unit mass of transducer (or polymer). Specific energy densities for embodiments of the present invention are commonly at least about 0.15 Joules per gram for the polymer and can be greater than 0.35 Joules per gram for some polymers.

Electrodes

As mentioned above, transducers of the present invention preferably include one or more electrodes for actuating an electroactive polymer. Generally speaking, electrodes suitable for use with the present invention may be of any shape and material provided they are able to supply or receive a suitable voltage, either constant or varying over time, to or from an electroactive polymer. In one embodiment, the electrodes adhere to a surface of the polymer. Electrodes adhering to the polymer are preferably compliant and conform to the changing shape of the polymer. The electrodes may be only applied to a portion of an electroactive polymer and define an active area according to their geometry.

The compliant electrodes are capable of deflection in one or more directions. Linear strain may be used to describe the deflection of a compliant electrode in one of these directions. As the term is used herein, linear strain of a compliant electrode refers to the deflection per unit length along a line of deflection. Maximum linear strains (tensile or compressive) of at least about 50 percent are possible for compliant electrodes of the present invention. For some compliant electrodes, maximum linear strains at least about 100 percent are common. Of course, an electrode may deflect with a strain less than the maximum. In one embodiment, the compliant electrode is a 'structured electrode' that comprises one or more regions of high conductivity and one or more regions of low conductivity.

Figure 3:
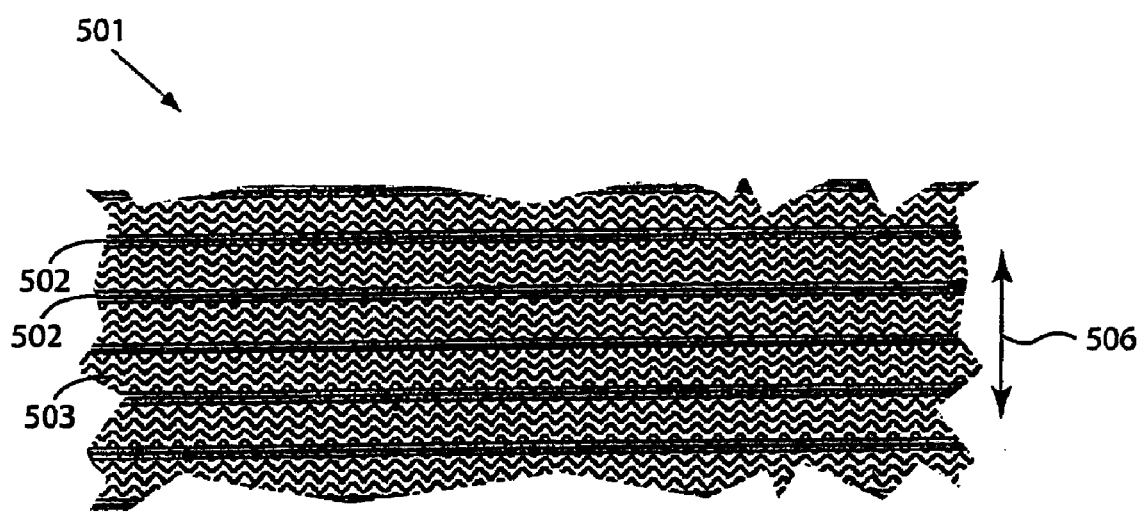
FIG. 3 illustrates a structured electrode that provides one-directional compliance according to a specific embodiment of the present invention.

FIG. 3 illustrates a top surface view of a structured electrode 501 that provides one-directional compliance in accordance with one embodiment of the present invention. The structured electrode 501 includes metal traces 502 patterned in parallel lines over a charge distribution layer 503—both of which cover an active area of a polymer (not shown). The metal traces 502 and charge distribution layer 503 are applied to opposite surfaces of the polymer. Thus, the cross section, from top to bottom, of a transducer including structured electrodes 501 on opposite surfaces is: top metal traces, top charge distribution layer, polymer, bottom charge distribution layer, bottom metal traces. Metal traces 502 on either surface of the polymer act as electrodes for electroactive polymer material between them. In another embodiment, the bottom electrode may be a compliant, uniform electrode. The charge distribution layer 503 facilitates distribution of charge between metal traces 502. Together, the high conductivity metal traces 502 quickly conduct charge across the active area to the low conductivity charge distribution layer 503 which distributes the charge uniformly across the surface of the polymer between the traces 502. The charge distribution layer 503 is compliant. As a result, the structured electrode 501 allows deflection in a compliant direction 506 perpendicular to the parallel metal traces 502.

Actuation for the entire polymer may be achieved by extending the length of the parallel metal traces 502 across the length of the polymer and by implementing a suitable number of traces 502 across the polymer width. In one embodiment, the metal traces 502 are spaced at intervals in the order of 400 micrometers and have a thickness of about 20 to 100 nanometers. The width of the traces is typically much less than the spacing. To increase the overall speed of response for the structured electrode 501, the distance between metal traces 502 may be reduced. The metal traces 502 may comprise gold, silver, aluminum and many other metals and relatively rigid conductive materials. In one embodiment, metal traces on opposite surfaces of an electroactive polymer are offset from one another to improve charge distribution through the polymer layer and prevent direct metal-to-metal electrical breakdowns.

Deflection of the parallel metal traces 502 along their axis greater than the elastic allowance of the metal trace material may lead to damage of the metal traces 502. To prevent damage in this manner, the polymer may be constrained by a rigid structure that prevents deflection of the polymer and the metal traces 502 along their axis. The rigid members 232 of the linear motion device of FIGS. 2D and 2E are suitable in this regard. In another embodiment, the metal traces 502 may be undulated slightly on the surface of the polymer 500. These undulations add compliance to the traces 502 along their axis and allow deflection in this direction.

Figure 4:
FIG. 4 illustrates a pre-strained polymer comprising a structured electrode that is not directionally compliant according to a specific embodiment of the present invention.

In general, the charge distribution layer 503 has a conductance greater than the electroactive polymer but less than the metal traces. The non-stringent conductivity requirements of the charge distribution layer 503 allow a wide variety of materials to be used. By way of example, the charge distribution layer may comprise carbon black, fluoroelastomer with colloidal silver, a water-based latex rubber emulsion with a small percentage in mass loading of sodium iodide, and polyurethane with tetrathiafulavalene/tetracyanoquinodimethane (TTF/TCNQ) charge transfer complex. These materials are able to form thin uniform layers with even coverage and have a surface conductivity sufficient to conduct the charge between metal traces 502 before substantial charge leaks into the surroundings. In one embodiment, material for the charge distribution layer 503 is selected based on the RC time constant of the polymer. By way of example, surface resistivity for the charge distribution layer 503 suitable for the present invention may be in the range of about $10^6$–$10^{11}$ ohms. It should also be noted that in some embodiments, a charge distribution layer is not used and the metal traces 502 are patterned directly on the polymer. In this case, air or another chemical species on the polymer surface may be sufficient to carry charge between the traces. This effect may be enhanced by increasing the surface conductivity through surface treatments such as plasma etching or ion implantation. FIG. 4 illustrates a pre-strained polymer 510 underlying a structured electrode that is not directionally compliant according to a specific embodiment of the present invention. The structured electrode includes metal traces 512 patterned directly on one surface of the electroactive polymer 510 in evenly spaced parallel lines forming a 'zig-zag' pattern. Two metal traces 512 on opposite surfaces of the polymer act as electrodes for the electroactive polymer 510 material between them. The 'zig-zag' pattern of the metal traces 512 allows for expansion and contraction of the polymer and the structure electrode in multiple directions 514 and 516.

Using an array of metal traces as described with respect to FIGS. 3 and 4 permits the use of charge distribution layers having a lower conductance. More specifically, as the spacing between metal traces decreases, the required conductance of the material between the traces may diminish. In this manner, it is possible to use materials that are not normally considered conductive to be used as a charge distribution layer. By way of example, polymers having a surface resistivity of $10^{10}$ ohms may be used as an charge distribution layer in this manner. In a specific embodiment, rubber was used as a charge distribution layer as part of a structured electrode on a polymer layer having a thickness of 25 micrometers and spacing between parallel metal traces of about 500 micrometers. In addition to reducing the required conductance for a charge distribution layer, closely spaced metal traces also increase the speed of actuation since the charge need only travel through the charge distribution layer for a short distance between closely spaced metal traces.

Although structured electrodes of the present invention have been described in terms of two specific metal trace configurations; structured electrodes in accordance with the present invention may be patterned in any suitable manner. As one skilled in the art will appreciate, various uniformly distributed metallic trace patterns may provide charge on the surface of a polymer while providing compliance in one or more directions. In some cases, a structured electrode may be attached to the surface of polymer in a non-uniform manner. As actuation of the polymer may be limited to an active region within suitable proximity of a pair of patterned metal traces, specialized active and non-active regions for an electroactive polymer may be defined by custom patterning of the metal traces. These active and non-active regions may be formed to custom geometries and high resolutions according to conventional metal trace deposition techniques. Extending this practice across the entire surface of an electroactive polymer, custom patterns for structured electrodes comprising numerous custom geometry active regions may result in specialized and non-uniform actuation of the electroactive polymer according to the pattern of the structured electrodes.

Figure 5:
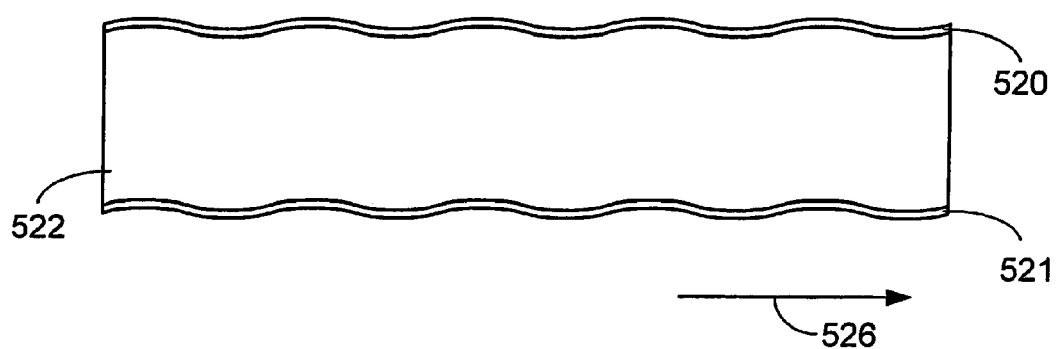
FIG. 5 illustrates textured electrodes in accordance with one embodiment of the present invention.

Although the present invention has been discussed primarily in terms of flat electrodes, 'textured electrodes' comprising varying out of plane dimensions may be used to provide a compliant electrode. FIG. 5 illustrates exemplary textured electrodes 520 and 521 in accordance with one embodiment of the present invention. The textured electrodes 520 and 521 are attached to opposite surfaces of an electroactive polymer 522 such that deflection of the polymer 522 results in planar and non-planar deformation of the textured electrodes 520 and 521. The planar and non-planar compliance of the electrodes 520 and 521 is provided by an undulating pattern which, upon planar and/or thickness deflection of the polymer 522, provides directional compliance in a direction 526. To provide substantially uniform compliance for the textured electrodes 520 and 521, the undulating pattern is implemented across the entire surface of the electroactive polymer in the direction 526. In one embodiment, the textured electrodes 520 and 521 are comprised of metal having a thickness which allows bending without cracking of the metal to provide compliance. Typically, the textured electrode 520 is configured such that non-planar deflection of the electrodes 520 and 521 is much less than the thickness of the polymer 522 in order to provide a substantially constant electric field to the polymer 522. Textured electrodes may provide compliance in more than one direction. In a specific embodiment, a rough textured electrode provides compliance in orthogonal planar directions. The rough textured electrode may have a topography similar to the rough surface of FIG. 1D.

In one embodiment, compliant electrodes of the present invention comprise a conductive grease such as carbon grease or silver grease. The conductive grease provides compliance in multiple directions. Particles may be added to increase the conductivity of the polymer. By way of example, carbon particles may be combined with a polymer binder such as silicone to produce a carbon grease that has low elasticity and high conductivity. Other materials may be blended into the conductive grease to alter one or more material properties. Conductive greases in accordance with the present invention are suitable for the deflection of at least about 100 percent strain.

Compliant electrodes of the present invention may also include colloidal suspensions. Colloidal suspensions contain submicrometer sized particles, such as graphite, silver and gold, in a liquid vehicle. Generally speaking, any colloidal suspension having sufficient loading of conductive particles may be used as an electrode in accordance with the present invention. In a specific embodiment, a conductive grease including colloidal sized conductive particles is mixed with a conductive silicone including colloidal sized conductive particles in a silicone binder to produce a colloidal suspension that cures to form a conductive semi-solid. An advantage of colloidal suspensions is that they may be patterned on the surface of a polymer by spraying, dip coating and other techniques that allow for a thin uniform coating of a liquid. To facilitate adhesion between the polymer and an electrode, a binder may be added to the electrode. By way of example, a water-based latex rubber or silicone may be added as a binder to a colloidal suspension including graphite.

In another embodiment, compliant electrodes are achieved using a high aspect ratio conductive material such as carbon fibrils and carbon nanotubes. These high aspect ratio carbon materials may form high surface conductivities in thin layers. High aspect ratio carbon materials may impart high conductivity to the surface of the polymer at relatively low electrode thicknesses due to the high interconnectivity of the high aspect ratio carbon materials. By way of example, thicknesses for electrodes made with common forms of carbon that are not high-aspect ratio may be in the range of 5-50 micrometers while thicknesses for electrodes made with carbon fibril or carbon nanotube electrodes may be less than 2-4 micrometers. Area expansions well over 100 percent in multiple directions are suitable with carbon fibril and carbon nanotube electrodes on acrylic and other polymers. High aspect ratio carbon materials may include the use of a polymer binder to increase adhesion with the electroactive polymer layer. Advantageously, the use of polymer binder allows a specific binder to be selected based on adhesion with a particular electroactive polymer layer and based on elastic and mechanical properties of the polymer.

In one embodiment, high-aspect-ratio carbon electrodes may be fabricated thin enough such that the opacity of the electrodes may be varied according to polymer deflection. By way of example, the electrodes may be made thin enough such that the electrode changes from opaque to semitransparent upon expansion. This ability to manipulate the opacity of the electrode may allow transducers of the present invention to be applied to a number of various optical applications as will be described below.

In another embodiment, mixtures of ionically conductive materials may be used for the compliant electrodes. This may include, for example, water based polymer materials such as glycerol or salt in gelatin, iodine-doped natural rubbers and water-based emulsions to which organic salts such as potassium iodide are added. For hydrophobic electroactive polymers that may not adhere well to a water based electrode, the surface of the polymer may be pretreated by plasma etching or with a fine powder such as graphite or carbon black to increase adherence.

Materials used for the electrodes of the present invention may vary greatly. Suitable materials used in an electrode may include graphite, carbon black, colloidal suspensions, thin metals including silver and gold, silver filled and carbon filled gels and polymers, ionically or electronically conductive polymers. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as Circuit Works 7200 as provided by ChemTronics Inc. of Kennesaw, Ga. The conductive grease may also be mixed with an elastomer, such as silicon elastomer RTV 118 as produced by General Electric of Waterford, N.Y., to provide a gel-like conductive grease.

It is understood that certain electrode materials may work well with particular polymers and may not work as well for others. By way of example, carbon fibrils work well with acrylic elastomer polymers while not as well with silicone polymers. For most transducers, desirable properties for the compliant electrode may include any one of a low modulus of elasticity, low mechanical damping, a low surface resistivity, uniform resistivity, chemical and environmental stability, chemical compatibility with the electroactive polymer, good adherence to the electroactive polymer, and an ability to form smooth surfaces. In some cases, it may be desirable for the electrode material to be suitable for precise patterning during fabrication. By way of example, the compliant electrode may be spray coated onto the polymer. In this case, material properties which benefit spray coating would be desirable. In some cases, a transducer of the present invention may implement two different types of electrodes. By way of example, a diaphragm device of the present invention may have a structured electrode attached to its top surface and a high aspect ratio carbon material deposited on the bottom side.

Electronic drivers are connected to the electrodes. The voltage provided to electroactive polymer will depend upon specifics of an application. In one embodiment, a transducer of the present invention is driven electrically by modulating an applied voltage about a DC bias voltage. Modulation about a bias voltage allows for improved sensitivity and linearity of the transducer to the applied voltage. By way of example, a transducer used in an audio application may be driven by a signal of up to 200 to 1000 volts peak to peak on top of a bias voltage ranging from about 750 to 2000 volts DC.

Applications

As the present invention includes transducers that may be implemented in both the micro and macro scales, and with a wide variety of actuator designs, the present invention finds use in a broad range of applications where conversion between electrical and mechanical energy is required. Provided below are several exemplary applications for some of the actuators described above. Broadly speaking, the transducers and actuators of the present invention may find use in any application requiring conversion between electrical and mechanical energy. These applications include robotics, sensors, motors, toys, micro-actuator applications, pumps, generators, etc.

As mentioned before, electroactive polymers, either individually or mechanically linked in a collection, may be referred to as artificial muscle. The term artificial muscle in itself implies that these actuators are well-suited for application to biologically inspired robots or biomedical applications where the duplication of muscle, mammalian or other, is desired. By way of example, applications such as prosthetic limbs, exoskeletons, and artificial hearts may benefit from pre-strained polymers of the present invention. The size scalability of electroactive polymers and the ability to use any number of transducers or polymer actuators in a collection allow artificial muscle in accordance with the present invention to be used in a range in applications greater than their biological counterparts. As transducers and actuators of the present invention have a performance range far outside their biological counterparts, the present invention is not limited to artificial muscle having a performance corresponding to real muscle, and may indeed include applications requiring performance outside that of real muscle.

In one example of artificial muscle, a collection of linear motion devices comprises two or more layers of pre-strained polymer sandwiched together and attached to two rigid plates at opposite edges of each polymer. Electrodes are sealed into the center between each of the polymer layers. All of the linear motion devices in the collection may take advantage of geometric constraints provided by the rigid plates and anisotropic pre-strain to restrict deformation of the polymer in the actuated direction. An advantage of the layered construction is that as many electroactive polymer layers as required may be stacked in parallel in order to produce the desired force. Further, the stroke of this linear motion device configuration may be increased by adding similar linear motion devices in series.

In the micro domain, the pre-strained polymers may range in thickness from several micrometers to several millimeters and preferably from several micrometers to hundreds of micrometers. Micro pre-strained polymers are well-suited for applications such as inkjets, actuated valves, micropumps, inchworm-type actuators, pointing mirrors, sound generators, microclamps, and micro robotic applications. Micro robotic applications may include micro robot legs, grippers, pointer actuators for CCD cameras, wire feeders for micro welding and repair, clamping actuators to hold rigid positions, and ultrasonic actuators to transmit data over measured distances. In another application, a diaphragm device may be implemented in an array of similar electroactive polymer diaphragms in a planar configuration on a single surface. By way of example, an array may include sixty-two diaphragms with the diameter of 150 micrometers each arranged in a planar configuration. In one embodiment, the array of diaphragm devices may be formed on a silicon wafer. Diaphragm device arrays produced in this manner may include, for example, from 5 to 10,000 or more diaphragms each having a diameter in the range of about 60 to 150 micrometers. The array may be placed upon grid plates having suitably spaced holes for each diaphragm.

In the macro domain, each of the actuators described above may be well suited to its own set of applications. For example, the inchworm-type actuator of FIG. 2I is suitable for use with small robots capable of navigating through pipes less than 2 cm in diameter. Other actuators are well-suited, for example, with applications such as robotics, solenoids, sound generators, linear actuators, aerospace actuators, and general automation.

In another embodiment, a transducer of the present invention is used as an optical modulation device or an optical switch. The transducer includes an electrode whose opacity varies with deflection. A transparent or substantially translucent pre-strained polymer is attached to the opacity varying electrode and deflection of the polymer is used to modulate opacity of device. In the case of an optical switch, the opacity varying transducer interrupts a light source communicating with a light sensor. Thus, deflection of the transparent polymer causes the opacity varying electrode to deflect and affect the light sensor. In a specific embodiment, the opacity varying electrode includes carbon fibrils or carbon nanotubes that become less opaque as electrode area increases and the area fibril density decreases. In another specific embodiment, an optical modulation device comprised of an electroactive polymer and an opacity varying electrode may be designed to precisely modulate the amount of light transmitted through the device.

Diaphragm devices may be used as pumps, valves, etc. In one embodiment, a diaphragm device having a pre-strained polymer is suitable for use as a pump. Pumping action is created by repeatedly actuating the polymer. Electroactive polymer pumps in accordance with the present invention may be implemented both in micro and macro scales. By way of example, the diaphragm may be used as a pump having a diameter in the range of about 150 micrometers to about 2 centimeters. These pumps may include polymer strains over 100 percent and may produce pressures of 20 kPa or more.

Figure 6:
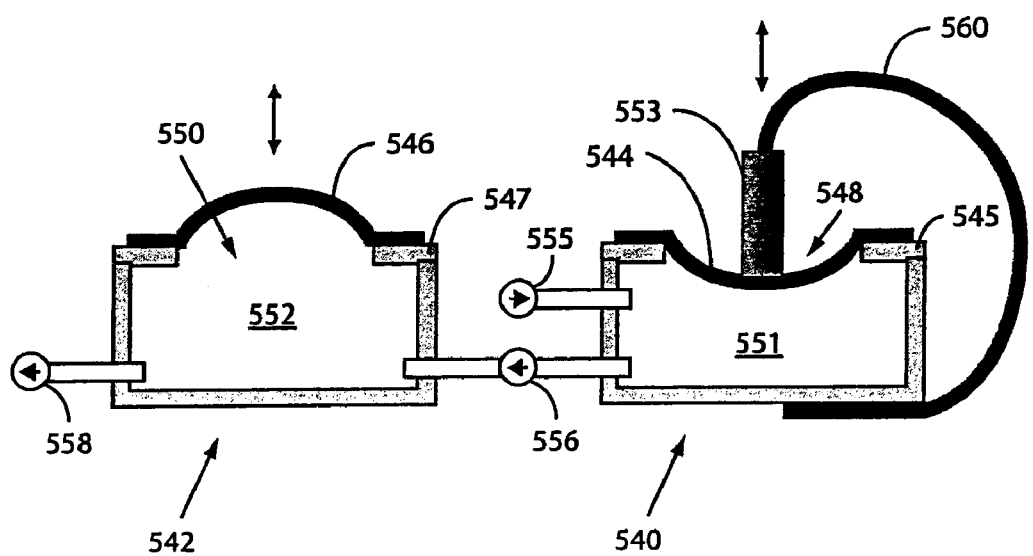
FIG. 6 illustrates a two-stage cascaded pumping system including two diaphragm device pumps in accordance with a specific embodiment of the present invention.

FIG. 6 illustrates a two-stage cascaded pumping system including diaphragm pumps 540 and 542 in accordance with a specific embodiment of the present invention. The diaphragm pumps 540 and 542 include pre-strained polymers 544 and 546 attached to frames 545 and 547. The polymers 544 and 546 deflect within holes 548 and 550 in the frames 545 and 547 respectively in a direction perpendicular to the plane of the holes 548 and 550. The frames 545 and 547 along with the polymers 544 and 546 define cavities 551 and 552. The pump 540 includes a plunger 553 having a flexure spring 560 for providing a bias to the diaphragm 544 towards the cavity 551.

A one-way valve 555 permits inlet of a fluid or gas into the cavity 551. A one-way valve 556 permits outlet of the fluid or gas out of the cavity 551 into the cavity 552. In addition, a one-way valve 558 permits exit of the fluid or gas from the cavity 552. Upon actuation of the polymers 544 and 546, the polymers deflect in turn to change the pressure within the cavities 551 and 552 respectively, thereby moving fluid or gas from the one-way valve 555 to the cavity 551, out the valve 556, into the cavity 552, and out the valve 558.

In the cascaded two-stage pumping system of FIG. 6, the diaphragm pump 542 does not include a bias since the pressurized output from the diaphragm pump 540 biases the pump 542. In one embodiment, only the first pump in a cascaded series of diaphragm pumps uses a bias pressure—or any other mechanism for self priming. In some embodiments, diaphragm pumps provided in an array may include voltages provided by electronic timing to increase pumping efficiency. In the embodiment shown in FIG. 6, polymers 544 and 546 are actuated simultaneously for best performance. For other embodiments which may involve more diaphragm pumps in the cascade, the electronic timing for the different actuators is ideally set so that one pump contracts in cavity volume while the next pump in the series (as determined by the one-way valves) expands. In a specific embodiment, the diaphragm pump 540 supplies gas at a rate of 40 ml/min and a pressure about 1 kPa while the diaphragm pump 542 supplies gas at substantially the same flow rate but increases the pressure to 2.5 kPa.

Bending beam devices, such as those described with respect to FIGS. 2K-2M, may be used in a variety of commercial and aerospace devices and applications such as fans, electrical switches and relays, and light scanners—on the micro and macro level. For bending beam actuators used as light scanners, a reflective surface such as aluminized mylar may be bonded to the free end of a bending beam actuator. More specifically, light is reflected when the bending beam is actuated and light passes when the bending beam is at rest. The reflector may then be used to reflect incoming light and form a scanned beam to form an arc or line according to the deflection of the actuator. Arrays of bending beam actuators may also be used for flat-panel displays, to control airflow over a surface, for low profile speakers and vibration suppressors, as "smart furs" for controlling heat transfer and/or light absorption on a surface, and may act as cilia in a coordinated manner to manipulate objects.

Polymers and polymer films that are rolled into a tubular or multilayer cylinder actuator may be implemented as a piston that expands axially upon actuation. Such an actuator is analogous to a hydraulic or pneumatic piston, and may be implemented in any device or application that uses these traditional forms of linear deflection.

An electroactive polymer actuator may also operate at high speeds for a variety of applications including sound generators and acoustic speakers, inkjet printers, fast MEMS switches etc. In a specific embodiment, an electroactive polymer diaphragm is used as a light scanner. More specifically, a mirror may be placed on a flexure that pushes down on a 5 mm diameter electroactive polymer diaphragm to provide a mirrored flexure. Good scanning of images at a scanning angle from about 10 to 30 degrees may be accomplished with voltages in the range of about 190 to 300 volts and frequencies in the range of about 30 to 300 Hz. Much larger scanning angles, up to 90 degrees for example, may also be accommodated using voltages in the range of 400 to 500 V. In addition, higher frequencies may be used with a stiffer mirrored flexure.

Transducers of the present invention also find wide use as generators for converting mechanical energy into electrical energy. In particular, generators of the present invention are well-suited for use as heel strike generators. More specifically, one or more transducers of the present invention may be used in a shoe to harness mechanical energy produced from walking into electrical energy. Typically, a generator includes a polymer arranged in a manner which causes a change in electric field and stored electrical energy in response to deflection of a portion of the polymer. A mechanical input, such as a heel-strike, expands the transducer in one or both planar directions parallel to the surface of the electrodes, thus increasing the stored elastic mechanical energy of the transducer. If electrical charge is then placed on the electrodes in the stretched state (or more charge is added in the stretched state) and the transducer is allowed to contract, the transducer converts some or all of its elastic mechanical energy to a greater amount of stored electrical energy. The greater stored electrical energy may then be recovered or harvested by circuitry in electrical communication with the electrodes. Some portion of the harvested energy can then be recycled back to provide the initial input electrical charge on the next cycle of expansion-contraction. Generators applications also include transducers coupled to conventional combustion engines to make fuel-driven electrical generators, hand-driven crank generators, wave-powered generators, wind-powered generators, and other types of generators where a mechanical input is available for stretching the transducer.

It should be noted that transducers of the present invention may be implemented to have more than one functionality. In other words, a transducer may act as an actuator, a generator and a sensor in the same design.

Fabrication

As the pre-strained polymers may be implemented both in the micro and macro scales, in a wide variety of actuator designs, with a wide range of materials, and in a broad range of applications, fabrication processes used with the present invention may vary greatly. In one aspect, the present invention provides methods for fabricating electromechanical devices including one or more pre-strained polymers.

Figure 7A:
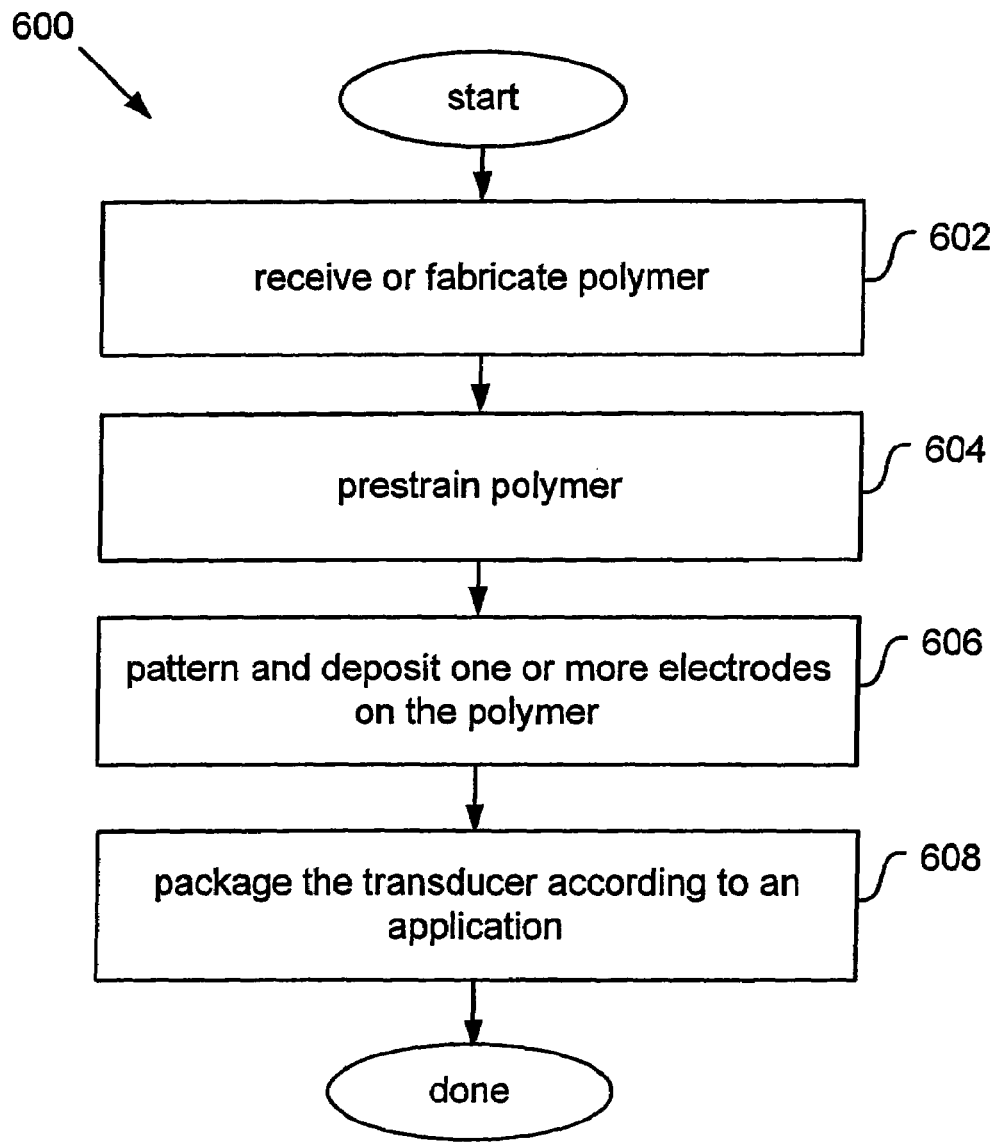
FIG. 7A illustrates a process flow for fabricating an electromechanical device having at least one pre-strained polymer in accordance with one embodiment of the present invention.
Figure 7B:
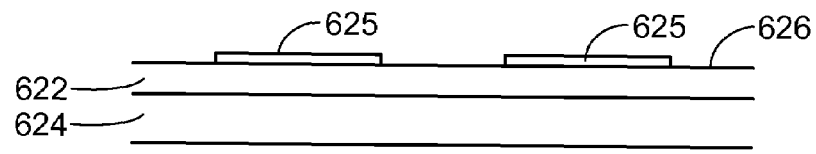
FIGS. 7B-F illustrate a process for fabricating an electromechanical device having multiple polymer layers in accordance with one embodiment of the present invention.
Figure 7C:
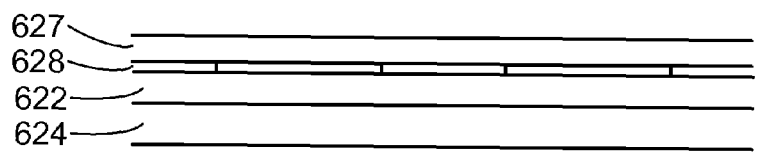

FIG. 7A illustrates a process flow 600 for fabricating an electromechanical device having at least one electroactive polymer layer in accordance with one embodiment of the present invention. Processes in accordance with the present invention may include up to several additional steps not described or illustrated here in order not to obscure the present invention. In some cases, fabrication processes of the present invention may include conventional materials and techniques such as commercially available polymers and techniques used in fabrication of microelectronics and electronics technologies. For example, micro diaphragm devices may be produced in situ on silicon using conventional techniques to form the holes and apply the polymer and electrodes.

The process flow 600 begins by receiving or fabricating a polymer (602). The polymer may be received or fabricated according to several methods. In one embodiment, the polymer is a commercially available product such as a commercially available acrylic elastomer film. In another embodiment, the polymer is a film produced by one of casting, dipping, spin coating or spraying. In one embodiment, the polymer is produced while minimizing variations in thickness or any other defects that may compromise the maximize electric field that can be applied across the polymer and thus compromise performance.

Spin coating typically involves applying a polymer mixture on a rigid substrate and spinning to a desired thickness. The polymer mixture may include the polymer, a curing agent and a volatile dispersant or solvent. The amount of dispersant, the volatility of the dispersant, and the spin speed may be altered to produce a desired polymer. By way of example, polyurethane films may be spin coated in a solution of polyurethane and tetrahydrofuran (THF) or cyclohexanone. In the case of silicon substrates, the polymer may be spin coated on an aluminized plastic or a silicon carbide. The aluminum and silicon carbide form a sacrificial layer that is subsequently removed by a suitable etchant. Films in the range of one micrometer thick may been produced by spin coating in this manner. Spin coating of polymer films, such as silicone, may be done on a smooth non-sticking plastic substrate, such as polymethyl methacrylate or teflon. The polymer film may then be released by mechanically peeling or with the assistance of alcohol or other suitable release agent. Spin coating is also suitable for producing thicker polymers in the range of 10-750 micrometers. In some cases, the polymer mixture may be centrifuged prior to spin coating to remove unwanted materials such as fillers, particulates, impurities and pigments used in commercial polymers. To increase centrifuge efficacy or to improve thickness consistency, a polymer may be diluted in a solvent to lower its viscosity; e.g. silicone may be disbursed in naptha.

The polymer may then be pre-strained in one or more directions (604). In one embodiment, pre-strain is achieved by mechanically stretching a polymer in or more directions and fixing it to one or more solid members (e.g., rigid plates) while strained. Another technique for maintaining pre-strain includes the use of one or more stiffeners. The stiffeners are long rigid structures placed on a polymer while it is in a pre-strained state, e.g. while it is stretched. The stiffeners maintain the pre-strain along their axis. The stiffeners may be arranged in parallel or other configurations to achieve directional compliance of the transducer. It should be noted that the increased stiffness along the stiffener axis comprises the increased stiffness provided by the stiffener material as well as the increased stiffness of the polymer in the pre-strain direction.

Surfaces on the pre-strained polymer may be textured. In one embodiment to provide texturing, a polymer is stretched more than it can stretch when actuated, and a thin layer of stiff material is deposited on the stretched polymer surface. For example, the stiff material may be a polymer that is cured while the electroactive polymer is stretched. After curing, the electroactive polymer is relaxed and the structure buckles to provide the textured surface. The thickness of the stiff material may be altered to provide texturing on any scale, including submicrometer levels. In another embodiment, textured surfaces are produced by reactive ion etching (RIE). By way of example, RIE may be performed on a pre-strained polymer comprising silicon with an RIE gas comprising 90 percent carbon tetrafluoride and 10 percent oxygen to form a surface with wave troughs and crests 4 to 5 micrometers in depth.

One or more electrodes are then formed on the polymer (606). For the silicone polymer altered by RIE mentioned above, a thin layer of gold may be sputter deposited on the RIE textured surface to provide a textured electrode. In another embodiment, one or more graphite electrodes may be patterned and deposited using a stencil. Electrodes comprising conductive greases mixed with a conductive silicone may be fabricated by dissolving the conductive grease and the uncured conductive silicone in a solvent. The solution may then be sprayed on the electroactive polymer material and may include a mask or stencil to achieve a particular pattern.

The metal traces of the structured electrodes of FIGS. 3 and 4 may be patterned photolithographically on top of the polymer or charge distribution layer. By way of example, a layer of gold is sputter deposited before depositing a photoresist over the gold. The photoresist and gold may be patterned according to conventional photolithographic techniques, e.g. using a mask followed by one or more rinses to remove the photoresist. A charge distribution layer added between the polymer and the metal traces may be deposited by spin coating, for example.

In a specific embodiment, a structured electrode is formed on a polymer by sputter depositing gold for about 2 to 3 minutes (according to a desired thickness) at about 150 angstroms per minute. HPR 506 photoresist as provided by Arch Chemicals, of Norwalk, Conn. is then spin coated on the gold at about 500 to 1500 rpm for about 20 to 30 seconds and then baked at about 90 degrees Celsius. A mask is then applied before exposing the photoresist to UV light and development to remove unmasked portions of the photoresist. The gold is then etched away and the film is rinsed. The remaining photoresist is removed by exposure to UV light, development and rinsing. The gold traces may then be stretched to enhance strain tolerance.

Textured electrodes of the present invention may also be patterned photolithographically. In this case, a photoresist is deposited on a pre-strained polymer and patterned using a mask. Plasma etching may remove portions of the electroactive polymer not protected by the mask in a desired pattern. The mask may be subsequently removed by a suitable wet etch. The active surfaces of the polymer may then be covered with the thin layer of gold deposited by sputtering, for example.

The transducer, comprising the one or more polymer layers and electrodes, is then packaged according to an application (608). Packaging may also include assembly of multiple transducers mechanically linked or stacked as multiple layers. In addition, mechanical and electrical connections to the transducers may be formed according to an application.

Fabrication of polymers may also include the addition of one or more additives. In the additives example described above, mineral oil was added to a solution of Kraton D2104 as produced by Shell Chemical of Houston, Tex. in a solvent such as butyl acetate to increase the dielectric breakdown strength. In a specific example, the solution contained 14.3 percent weight mineral oil and 32.1 percent weight Kraton D2104. The solution was then cast onto glass and heated in an oven at 95 degrees Celsius to remove any residual solvent and produce the electroactive polymer. The polymer was then stretched on a frame by 150 percent by 150 percent. Carbon grease electrodes were then smeared on opposite surfaces of the polymer. This process produced a transducer having a maximum linear strain in the range of about 70 to 100 percent.

The present invention also provides alternative methods for fabricating electromechanical devices including multiple layers of pre-strained polymer. In one embodiment, a process for fabricating electromechanical devices begins by obtaining or fabricating a polymer layer. The polymer is then stretched to the desired pre-strain and attached to a first rigid frame. Next electrodes are deposited onto both sides of the polymer so as to define active areas and establish electrical connections. The electrodes may be patterned by a variety of well-known techniques such as spray coating through a mask. If desired, a second polymer layer is then stretched on a second frame. Electrodes are then patterned on this second polymer layer. The second polymer layer is then coupled to the first layer by stacking their respective frames. Layers of suitable compliant adhesives may be used to bond the two layers and electrodes, if needed. The size of the frames is chosen so as not to interfere with the polymer layers making intimate contact. If interference is present, then it may be desirable to remove the second frame, e.g., by cutting away the polymer layer around the periphery of the first frame. If desired, a third layer of polymer with electrodes may be added in a manner similar to how the second layer was added to the first. This procedure may be continued until a desired number of layers is reached.

Rigid frames, rigid members or other electrical and mechanical connectors are then attached to the polymer layers, e.g., by gluing. If desired, the polymer may then be removed from the first frame. In some cases, the first frame may serve as a structural part of the final actuator or actuators. For example, the first frame may be an array of holes to produce an array of diaphragm devices.

FIGS. 7B-F illustrate a second process for fabricating an electromechanical device 640 having multiple layers of electroactive polymer in accordance with another embodiment of the present invention. Processes in accordance with the present invention may include up to several additional steps not described or illustrated here in order not to obscure the present invention. The process begins by producing a pre-strained polymer 622 on a suitable rigid substrate 624, e.g. by spin coating a polymer on a polymethyl methacrylate (PMMA) disk, stretching the polymer (FIG. 7B) and then attaching it to rigid substrate 624. After the polymer 622 is cured, electrodes 625 are patterned on the exposed side 626 of the polymer 622. A solid member 627 such as a flexible film including one of polyimide, mylar or acetate film is then deposited onto the electroactive polymer 622 (FIG. 7C) with a suitable adhesive 628.

Figure 7D:
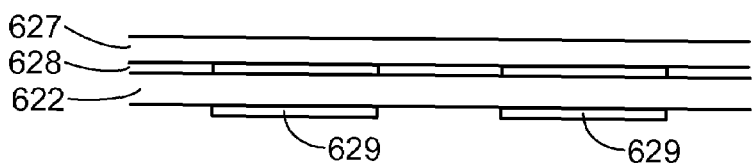
Figure 7E:
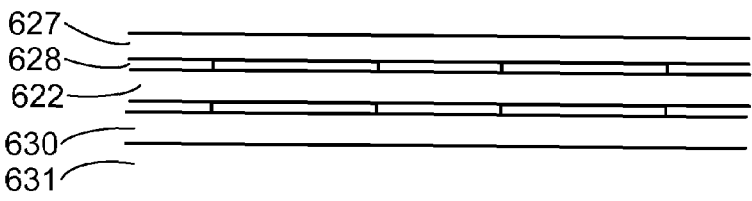

The rigid substrate 624 is then released from the electroactive polymer 622 (FIG. 7D). A releasing agent such as isopropyl alcohol may be used to facilitate the release. Electrodes 629 are then patterned on the previously unexposed side of the polymer 622. The assembly is then bonded to another electroactive polymer layer 630 attached to a rigid substrate 631 (FIG. 7E). Polymer layers 622 and 630 may be bonded by an adhesive layer 632 comprising GE RTV 118 silicone, for example. The rigid substrate 631 is then released from the polymer 630 and electrodes 633 are patterned on the available side 634 of the polymer 630. If additional polymer layers are desired, the steps of adding a polymer layer, removing the rigid substrate, and adding electrodes may be repeated to produce as many polymer layers as desired. Polymer layer 635 has been added in this manner. To facilitate electrical communication to electrodes in the inner layers of the device 640, a metal pin may be pushed through the structure to make contact with electrodes in each layer.

Figure 7F:
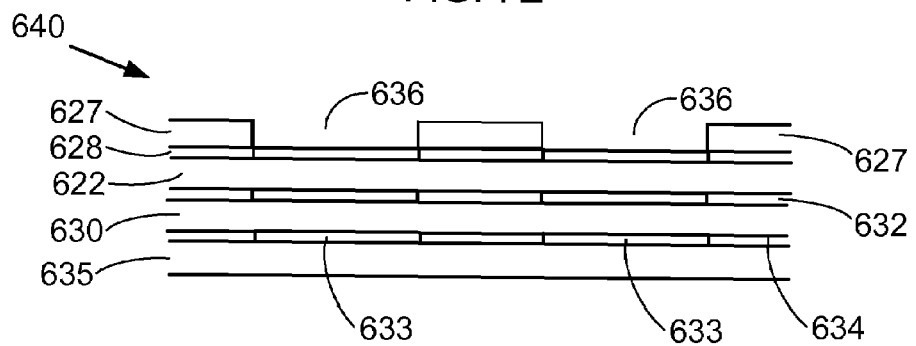

The solid member 627 may then be patterned or removed as needed to provide the frame or mechanical connections required by the specific actuator type. In one embodiment, diaphragm devices may be formed by patterning solid member 627 to form holes 636 which provide active regions for the electromechanical device 640 using a suitable mask or etch technique (FIG. 7F). In another embodiment, if the active area is not large and electrodes may be added to the active regions of the polymers without damage, the solid member 627 may be patterned with the holes 636 prior to attachment to the polymer 622.

For the process of FIGS. 7B-F, the rigid substrate 624 is typically released from the electroactive polymer 622 by peeling the flexible electroactive polymer. Peeling is well-suited for fabricating devices comprising electroactive polymers with a substantially flat profile. In another embodiment, sacrificial layers may be used between the polymer or electrodes and the rigid substrate to facilitate release. The sacrificial layers allow the polymer, electrodes and attached assembly to be released from a rigid substrate by etching away the sacrificial layer. Metals comprising aluminum and silver are suitable for use as the sacrificial layers, for example. The use of metals allows the sacrificial layers to be etched away by liquids that do not affect the polymer layers. Metal sacrificial layers may also be easily patterned with various masking techniques to provide frames, connectors for other structural components for the electromechanical device 640. The sacrificial layers may also be used to fabricate devices comprising transducers with non flat profiles, e.g. using rigid substrates shaped as tubes. For geometrically complex transducers, sacrificial layers may be used in combination with dip coating to provide the complex geometry.

Although fabrication of pre-strained polymers has been briefly described with respect to a few specific examples, fabrication processes and techniques of the present invention may vary accordingly for any the actuators or applications described above. For example, the process for fabricating a diaphragm device in accordance with a specific embodiment may include spin coating a polymer on a substrate before a structured electrode is fabricated on the polymer. The polymer is then stretched and rigid frames including one or more holes sized for the active area of each diaphragm device are bonded to the pre-strained polymer, including any overlap portions of the structured electrode. In another embodiment, holes are etched into the substrate instead of using a separate rigid frame, e.g. when the substrate is comprised of silicon. The substrate is then released from the polymer and an electrode is attached to the bottom side of the polymer.

CONCLUSION

While this invention has been described in terms of several preferred embodiments, there are alterations, permutations, and equivalents that fall within the scope of this invention which have been omitted for brevity's sake. By way of example, although the present invention has been described in terms of several numerous applied material electrodes, the present invention is not limited to these materials and in some cases may include air as an electrode. In addition, although the present invention has been described in terms of several preferred polymer materials and geometries having particular performance ranges, the present invention is not limited to these materials and geometries and may have performances outside the ranges listed. It is therefore intended that the scope of the invention should be determined with reference to the appended claims.

What is claimed is:

1. An electrode for use with an electroactive polymer, the electrode comprising:
a compliant portion in contact with a portion of the electroactive polymer, wherein the compliant portion comprises one or more regions of high conductivity and one or more regions of low conductivity, and wherein the one or more regions of low conductivity comprise a charge distribution layer that has a conductance greater than the electroactive polymer.

2. The electrode of claim 1 wherein the regions of high conductivity comprise a set of patterned traces.

3. The electrode of claim 2 wherein the set of patterned traces comprise a metal material.

4. The electrode of claim 2 wherein the set of patterned traces are configured to allow expansion and contraction of the electroactive polymer in multiple directions.

5. The electrode of claim 4 wherein the set of patterned traces include a zig-zag pattern.

6. The electrode of claim 1 wherein the patterned metal traces are offset from patterned metal traces included in a second electrode on an opposing side of the electroactive polymer.

7. The electrode of claim 1 wherein the charge distribution layer has a conductance less than a material used in the one or more regions of high conductivity.

8. The electrode of claim 1 wherein the one or more regions of low conductivity has a surface resistivity in the range of about $10^6$ ohms to about $10^{11}$ ohms.

9. The electrode of claim 1 wherein the electrode is patterned to form an active area according to the geometry of the electrode.

10. The electrode of claim 9 wherein the set of patterned traces form the active area according to the geometry of the patterned traces.

11. The electrode of claim 1 wherein the electroactive polymer includes an additive.

12. The electrode of claim 11 wherein the additive improves at least one of polymer dielectric breakdown strength, maximum linear strain, dielectric constant, elastic modulus, response time, and actuation voltage.

13. The electrode of claim 1 wherein the charge distribution layer includes carbon black.

14. The electrode of claim 1 wherein the charge distribution layer includes colloidal silver.

* * * * *